United States Patent
Kang

(10) Patent No.: US 9,917,614 B1
(45) Date of Patent: Mar. 13, 2018

(54) LOW NOISE AMPLIFIER FOR CARRIER AGGREGATION AND APPARATUS INCLUDING THE SAME

(71) Applicant: Samsung Electronics Co., Ltd., Suwon-si, Gyeonggi-do (KR)

(72) Inventor: Byoung-joong Kang, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/437,735

(22) Filed: Feb. 21, 2017

(30) Foreign Application Priority Data

Dec. 16, 2016 (KR) ........................ 10-2016-0172901

(51) Int. Cl.
| | |
|---|---|
| *H04B 1/38* | (2015.01) |
| *H04B 1/40* | (2015.01) |
| *H03F 3/72* | (2006.01) |
| *H03G 3/30* | (2006.01) |

(52) U.S. Cl.
CPC ................ *H04B 1/40* (2013.01); *H03F 3/72* (2013.01); *H03G 3/30* (2013.01); *H03F 2200/06* (2013.01); *H03F 2200/294* (2013.01); *H03F 2200/411* (2013.01); *H03F 2200/541* (2013.01)

(58) Field of Classification Search
None
See application file for complete search history.

(56) References Cited

U.S. PATENT DOCUMENTS

| | | | |
|---|---|---|---|
| 4,717,896 A * | 1/1988 | Graham | H03H 7/42 333/25 |
| 5,745,367 A | 4/1998 | Cha | |
| 5,920,473 A | 7/1999 | Sturgeon | |
| 7,352,247 B2 | 4/2008 | Oh et al. | |
| 7,705,675 B2 | 4/2010 | McMorrow | |
| 7,786,806 B2 | 8/2010 | Duperray | |
| 7,808,319 B2 | 10/2010 | Kim et al. | |
| 7,853,235 B2 | 12/2010 | Aparin | |
| 7,859,340 B2 | 12/2010 | Miao et al. | |

(Continued)

FOREIGN PATENT DOCUMENTS

| | | |
|---|---|---|
| JP | 2000-040620 A | 2/2000 |
| KR | 10-0190629 B1 | 6/1999 |
| KR | 100956000 B1 | 5/2010 |

OTHER PUBLICATIONS

V. Aparin et al., "Modified derivative superposition method for linearizing FET low-noise amplifiers" IEEE Transactions on Microwave Theory and Techniques, vol. 53, No. 2, Feb. 2005 (571-581).

(Continued)

*Primary Examiner* — Mohammed Rachedine
(74) *Attorney, Agent, or Firm* — Harness, Dickey & Pierce, P.L.C.

(57) ABSTRACT

Provided is an apparatus. The apparatus includes an input terminal configured to receive an input signal including at least one carrier, a first amplifier stage electrically connected to the input terminal, enabled in a first mode to output a first output signal by amplifying the input signal, and disabled in a second mode, and a second amplifier stage electrically connected to the input terminal, enabled in the second mode to output second and third output signals by amplifying the input signal, and disabled in the first mode.

20 Claims, 26 Drawing Sheets

(56) References Cited

U.S. PATENT DOCUMENTS 9,154,356 B2 10/2015 Tasic et al.
2016/0072443 A1* 3/2016 Mizokami ............... H03F 1/565
330/295

OTHER PUBLICATIONS

M. Liu et al. "A 5-GHz BiCMOS Variable-gain Low Noise Amplifier with Inductorless Low-gain Branch." Proceeding of ESSCIRC, Grnoble, France, 2005 (223-226).
S. Hwu et al, "An RF Receiver for Intra-Band Carrier Aggregation,Sy-Chyuan Hwu and Behzad Razavi, Fellow," IEEE, vol. 50, No. 4, Apr. 2015.
L. Sundström et al., "A Receiver for LTE Rel-11 and Beyond Supporting Non-Contiguous Carrier Aggregation," IEEE International Solid-State Circuits Conference 2013.
M. Mikhemar et al, "A Rel-12 2G/3G/LTE-Advanced 3CC Cellular Receiver," IEEE Journal of Solid-State Circuits, Vo. 51, No. 5, May 2016.
Published Announcement, Samsung Galaxy Note 7, https://en.wikipedia.org/wiki/Samsung_Galaxy_Note_7, Dec. 22, 2010.
Published Announcement, Samsung Galaxy S7 and Samsung Galaxy S7 Edge, https://en.wikipedia.org/wiki/Samsung_Galaxy_S7, Dec. 23, 2016.

* cited by examiner

US 9,917,614 B1

LOW NOISE AMPLIFIER FOR CARRIER AGGREGATION AND APPARATUS INCLUDING THE SAME

CROSS-REFERENCE TO RELATED APPLICATION

This application claims the benefit of Korean Patent Application No. 10-2016-0172901, filed on Dec. 16, 2016, in the Korean Intellectual Property Office, the disclosure of which is incorporated herein in its entirety by reference.

BACKGROUND

1. Field

The inventive concepts relate to wireless communication, and more particularly, to a low noise amplifier for carrier aggregation and an apparatus including the same.

2. Description of the Related Art

Carrier aggregation may refer to the use of a plurality of carriers together in transmission to one wireless communication device or in transmission from one wireless communication device. A frequency domain transmitted by one carrier may be referred to as a frequency channel, and an amount of data transmitted through wireless channels may be increased due to carrier aggregation supporting a plurality of frequency channels. In the carrier aggregation, frequency channels through which data is transmitted may be variously arranged, and a transmitter, receiver, or transceiver of a wireless communication device is required to support various arrangements of such frequency channels.

SUMMARY

The inventive concepts provide a low noise amplifier which efficiently supports variously arranged frequency channels in a wireless communication system, an apparatus including the same, and a method of amplifying a signal.

According to an aspect of the inventive concepts, there is provided an apparatus. The apparatus may include an input terminal configured to receive an input signal including at least one carrier, a first amplifier stage electrically connected to the input terminal, enabled in a first mode to output a first output signal by amplifying the input signal, and disabled in a second mode, and a second amplifier stage electrically connected to the input terminal, enabled in the second mode to output second and third output signals by amplifying the input signal, and disabled in the first mode.

According to another aspect of the inventive concepts, there is provided a method of amplifying an input signal in an apparatus. The method may include enabling a first amplifier stage and disabling a second amplifier stage in a first mode, amplifying an input signal including at least one carrier and transmitted to an input terminal by the first amplifier stage in the first mode in order to obtain a first output signal, disabling the first amplifier stage and enabling the second amplifier stage in a second mode, and amplifying the input signal transmitted to the input terminal by the second amplifier stage in the second mode in order to obtain second and third output signals.

According to another aspect of the inventive concepts, there is provided an apparatus comprise an input terminal configured to receive an input signal including at least one carrier, a first amplifier electrically connected to the input terminal, the first amplifier configured to amplify the input signal and to output a first output signal if the first amplifier receives a first enable signal, the first output signal including the amplified input signal, and a second amplifier electrically connected to the input terminal, the second amplifier configured to amplify the input signal and output a second output signal and a third output signal if the second amplifier receives a second enable signal, the second output signal including the amplified input signal and the third output signal including the amplified input signal.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
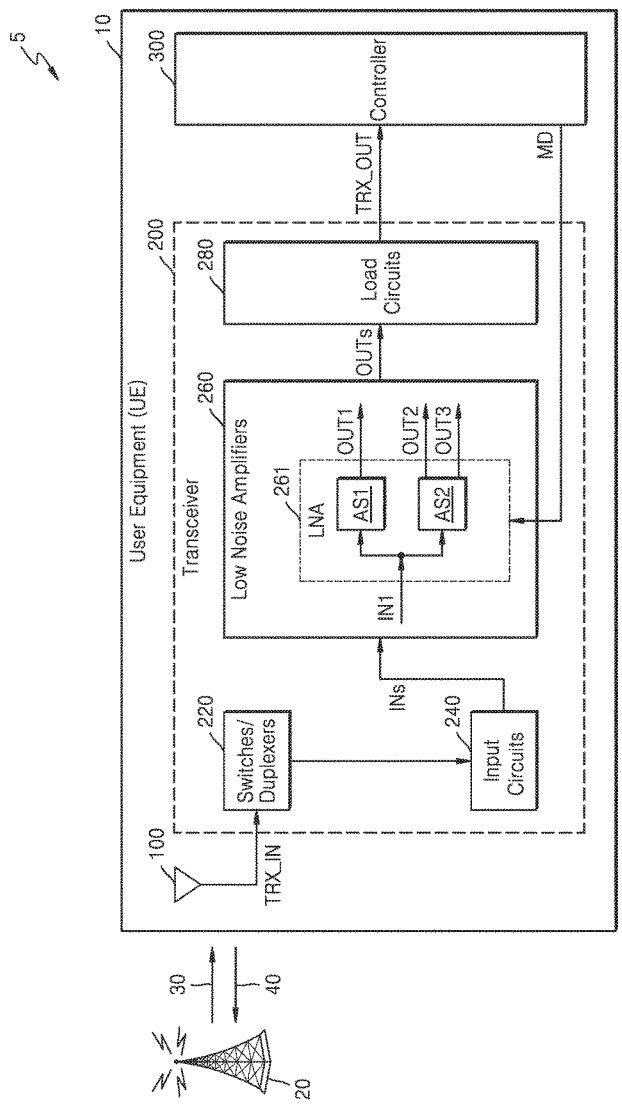
FIG. 1 is a block diagram illustrating a wireless communication system including a user equipment and a base station according to an example embodiment of the inventive concepts.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

FIG. 1 is a block diagram illustrating a wireless communication system 5 including a user equipment (UE) 10 and a base station (BS) 20 according to an example embodiment of the inventive concepts. As illustrated in FIG. 1, the UE 10 and the BS 20 may communicate with each other through a downlink (DL) 30 and an uplink (UL) 40.

The wireless communication system 5 may be a Long-Term Evolution (LTE) system, a code division multiple access (CDMA) system, a Global System for Mobile Communications (GSM) system, a wireless local area network (WLAN) system, or another wireless communication system as a non-limiting example. The UE 10, which is a wireless communication device, may be fixed or may be moved, and may refer to various devices which may communicate with the BS 20 to transmit and receive data and/or control information. For example, the UE 10 may be referred to as a terminal equipment, a mobile station (MS), a mobile terminal (MT), a user terminal (UT), a subscribe station (SS), a wireless device, a handheld device, or the like. The BS 20 may generally refer to a fixed station which communicates with the UE and/or another BS, and may exchange data and control information by communicating with the UE and/or another BS. For example, the BS 20 may be referred to as a node B, an evolved-Node B (eNB), a base transceiver system (BTS), an access point (AP), or the like.

The wireless communication network between the UE 10 and the BS 20 may support communication of multiple users by sharing available network resources. For example, in a wireless communication network, information may be transferred in various methods such as CDMA, frequency division multiple access (FDMA), time division multiple access (TDMA), orthogonal frequency division multiple access (OFDMA), single carrier frequency division multiple access (SC-FDMA), and the like.

The wireless communication system 5 may support carrier aggregation using a plurality of carriers. That is, the UE 10 and the BS 20 may transmit or receive data using a plurality of carriers simultaneously. Carriers used by the UE 10 and the BS 20 in carrier aggregation may be referred to as component carriers, and a frequency domain transmitted by one component carrier may be referred to as a frequency channel. A frequency channel may be included in a frequency band, and the frequency band may include a plurality of contiguous frequency channels. For example, in LTE, a width of a frequency channel covered by one component carrier may be 20 MHz, and one frequency band may cover up to 200 MHz. As described below with reference to FIG. 2, frequency channels used by the UE 10 and the BS 20 may be variously arranged.

The UE 10 (or the BS 20) may include a structure for appropriately processing signals received through various frequency channels. For example, the UE 10 may include a receiver (or a transceiver 200) for separating the frequency channels from each other. Also, the receiver may also support transmission not using carrier aggregation, that is, processing of signals including one carrier. Referring to FIG. 1, the UE 10 may include an antenna 100, the transceiver 200, and a controller 300.

The antenna 100 may provide a transceiver input signal TRX_IN by receiving a signal, which is transmitted by the BS 20 and includes at least one carrier. The transceiver 200 may provide a transceiver output signal TRX_OUT from the transceiver input signal TRX_IN provided from the antenna 100. For example, the transceiver 200 may provide a transceiver output signal TRX_OUT including at least one signal in a baseband from the transceiver input signal TRX_IN received through the plurality of frequency channels.

The controller 300 may detect data transmitted by the BS 20 by processing the transceiver output signal TRX_OUT, for example, by performing sampling, demodulation, decoding, and the like. Also, the controller 300 may set a mode of the transceiver 200 according to a preset type of carrier aggregation. For example, carriers used by the BS 20 to transmit signals may be preset, and the controller 300 may generate a mode signal MD based on the set carriers.

The mode (or an operation mode) of the transceiver 200 may be determined according to the mode signal MD provided by the controller 300. That is, the transceiver 200 may provide the transceiver output signal TRX_OUT by processing the transceiver input signal TRX_IN differently according to the mode signal MD. As illustrated in FIG. 1, the transceiver 200 may include switches/duplexers 220, input circuits 240, low noise amplifiers (LNAs) 260, and load circuits 280.

Figure 12:
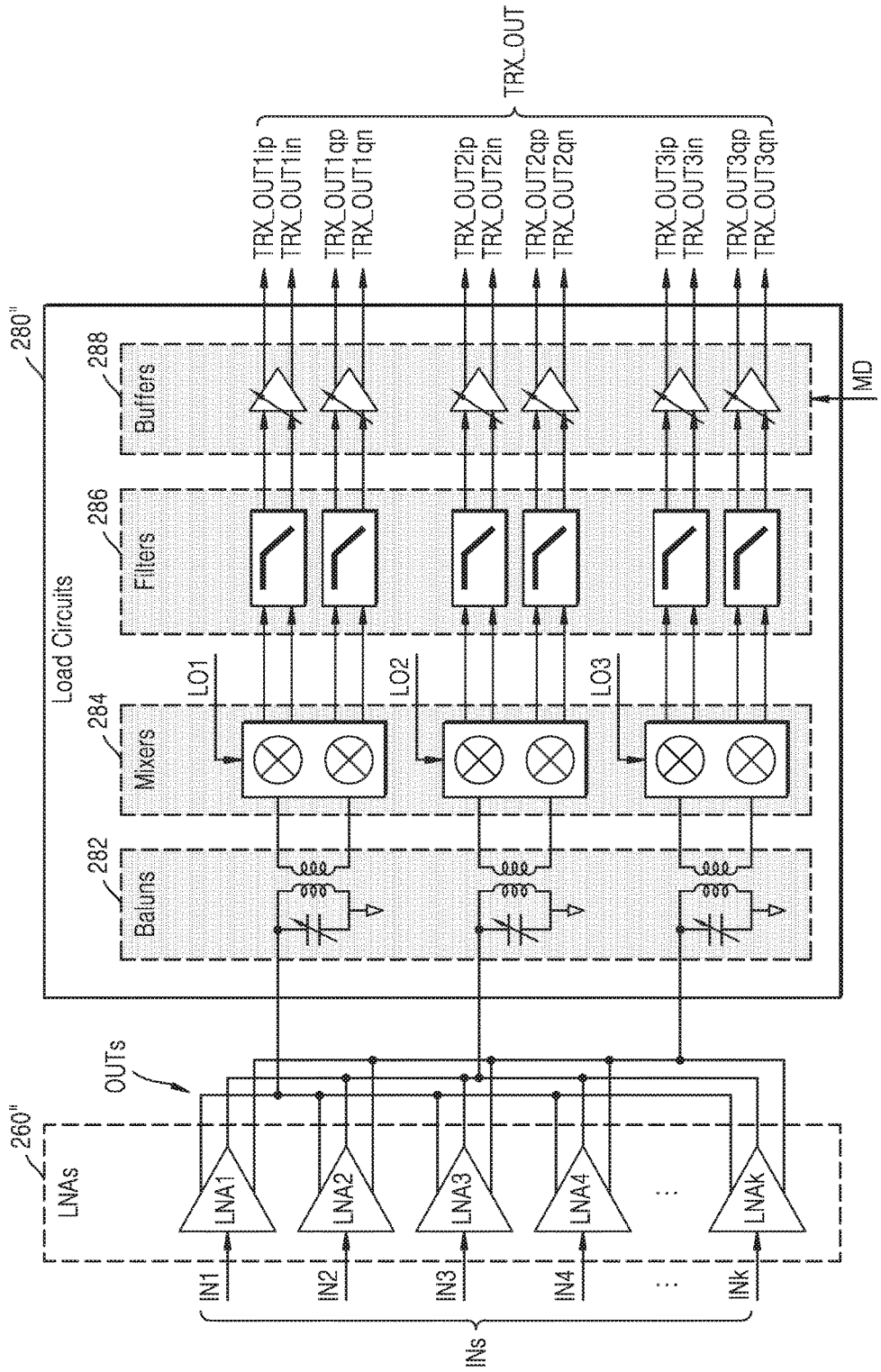
FIG. 12 is a block diagram illustrating an example of the LNAs and the load circuits of FIG. 1 according to an example embodiment of the inventive concepts.

The switches/duplexers 220 may route the transceiver input signal TRX_IN to provide to the input circuits 240. The input circuits 240 may include matching circuits which perform power and/or impedance matching between the antenna 100 or the switches/duplexers 220 and the LNAs 260, and may provide input signals INs. As illustrated in FIG. 12, the input signals INs may be provided through a plurality of lines.

The LNAs 260 may provide output signals OUTs by amplifying the input signals INs. The output signals OUTs output from the LNAs 260 by amplifying the input signals INs may be related to carriers. For example, signals included in the output signals OUTs may correspond to carriers, that is, frequency channels, respectively. Accordingly, as described below, the load circuits 280 may include mixers, the mixers may down-convert each of the signals included in the output signals OUTs based on the carriers, and the load circuits 280 may provide the transceiver output signal TRX_OUT including a plurality of baseband signals. As described above, the carriers included in the input signals INs (or the transceiver input signal TRX_IN) may be variously set, and the LNAs 260 may provide the output signals OUTs according to the setting of the carriers.

A LNA 261 included in the LNAs 260 may output a signal, which is obtained by amplifying a signal received through one line, through at least one line. For example, as illustrated in FIG. 1, the LNA 261 may output a first output signal OUT1 or second and third output signals OUT2 and OUT3 by amplifying a first input signal IN1 included in the input signals INs based on the setting of the carriers. For example, the signal output from the LNA 261 may be determined based on the mode signal MD received from the controller 300, and the LNA 261 may include a first amplifier stage AS1 and a second amplifier stage AS2 as illustrated in FIG. 1.

The first amplifier stage AS1 may receive the first input signal IN1, and may be enabled or disabled based on the mode signal MD. The enabled first amplifier stage AS1 may output the first output signal OUT1 by amplifying the first input signal IN1. The second amplifier stage AS2 may receive the first input signal IN1, and may be enabled or disabled based on the mode signal MD. The enabled second amplifier stage AS2 may output the second and third output signals OUT2 and OUT3 by amplifying the first input signal IN1.

The first and second amplifier stages AS1 and AS2 may be exclusively enabled. For example, the first amplifier stage AS1 may be enabled in a first mode and the second amplifier stage AS2 may be enabled in a second mode based on the mode signal MD received from the controller 300. Accordingly, the first input signal IN1 may be amplified by the first amplifier stage AS1 or by the second amplifier stage AS2. As described below with reference to FIGS. 5A and 5B, the first and second amplifier stages AS1 and AS2 may be designed so that a difference between an input impedance of the LNA 261 in the first mode and an input impedance of the LNA 261 in the second mode is reduced. Accordingly, variation of the input impedance of the LNA 261 may be reduced, and variation of an attenuation ratio of the first input signal IN1 according to the variation of the input impedance may also be reduced. As a result, since the first and second amplifier stages AS1 and AS2 do not need to have a high gain due to the variation of the input impedance, the first and second amplifier stages AS1 and AS2 may have good characteristics (e.g., linearity and bandwidth). Details of the LNA 261 will be described with reference to FIG. 4 and the like.

The load circuits 280 may receive the output signals OUTs through a plurality of lines, and provide the transceiver output signal TRX_OUT. For example, as described below with reference to FIG. 12, the load circuits 280 may include a plurality of mixers, filters, and buffers, and the mixers, filters, and buffers, which are connected in series, may extract a signal transmitted by one carrier.

As described above, the LNA 261 according to the example embodiment of the inventive concepts may have a structure in which an amplification path of the first input signal IN1 is changed according to the setting of the carriers (or the arrangement of the frequency channels), and thus the frequency channels may be efficiently separated despite the variation of the arrangement of the frequency channels. Hereinafter, it will be appreciated that while example embodiments of the inventive concepts will be described with reference to the UE 10, the example embodiments are also applicable to the BS 20 which receives the signals from the UE 10 through the plurality of frequency channels. Also, according to the example embodiments of the inventive concepts, the LNAs 260 may be included in a single package as semiconductor devices, the LNAs 260 and the load circuits 280 may be included in a single package as semiconductor devices, or the transceiver 200 may be included in a single package as a semiconductor device.

Figure 2A:
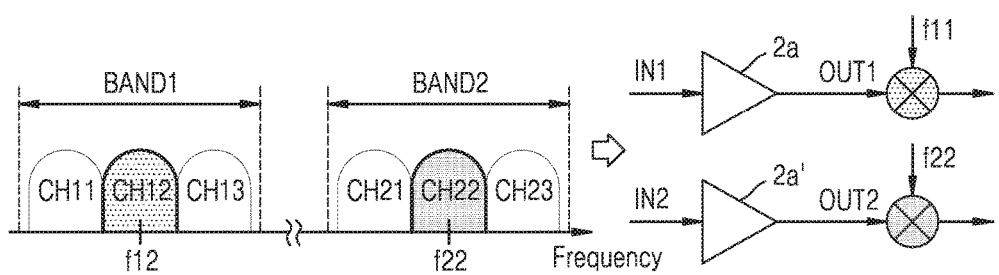
FIGS. 2A to 2C are views illustrating example types of carrier aggregation and example structures for extracting signals from frequency channels corresponding to the types of carrier aggregation.
Figure 2B:
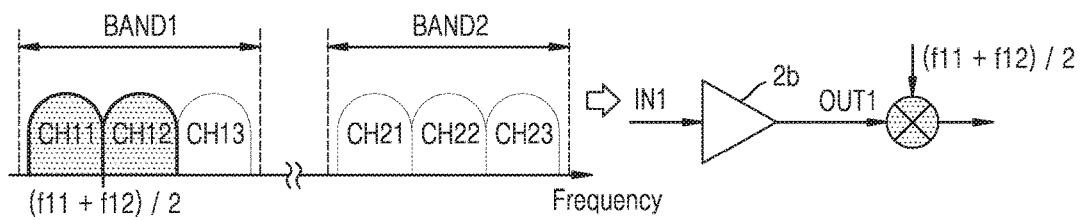
Figure 2C:
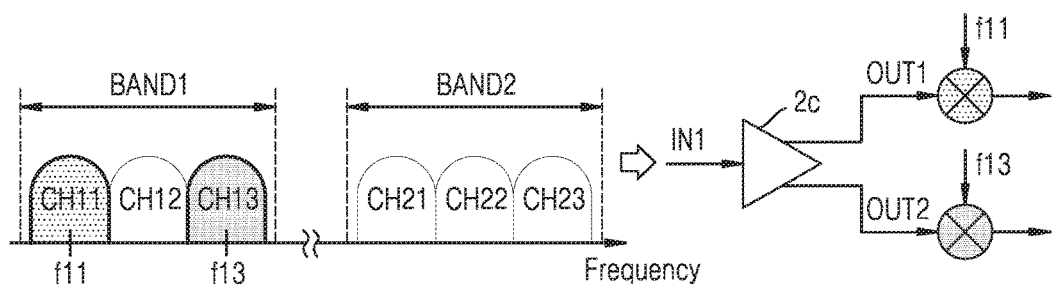

FIGS. 2A to 2C are views illustrating example types of carrier aggregation and example structures for extracting signals from frequency channels corresponding to the types of carrier aggregation. Specifically, FIG. 2A illustrates inter-band carrier aggregation, FIG. 2B illustrates contiguous intra-band carrier aggregation, and FIG. 2C illustrates non-contiguous intra-band carrier aggregation. In the examples of FIGS. 2A to 2C, two bands BAND1 and BAND2 may be used for transmission of signals, and one band may have three frequency channels (or three carriers).

Referring to FIG. 2A, in inter-band carrier aggregation, frequency channels in use may be arranged in different bands, respectively. For example, as illustrated in FIG. 2A, frequency channels CH12 and CH22 in use may be included in the first and second bands BAND1 and BAND2, respectively, and thus may be relatively far apart from each other. Two noise amplifiers 2a and 2a' may output first and second output signals OUT1 and OUT2 by amplifying first and second input signals IN1 and IN2, respectively, and the first and second output signals OUT1 and OUT2 may be down-converted, that is, converted into baseband signals, by frequencies f11 and f22 corresponding to the frequency channels CH12 and CH22, respectively.

Referring to FIG. 2B, in contiguous intra-band carrier aggregation, frequency channels in use may be continuously arranged in the same band. For example, as illustrated in FIG. 2B, frequency channels CH11 and CH12 in use may be included in a first band BAND1, and may be adjacent to each other. A LNA 2b may output a first output signal OUT1 by amplifying a first input signal IN1, and the first output signal OUT1 may be down-converted by an intermediate frequency (i.e., (f11+f12)/2) of frequencies f11 and f12 of carriers corresponding to the frequency channels CH11 and CH12 in use, respectively.

Referring to FIG. 2C, in non-contiguous intra-band carrier aggregation, frequency channels in use may be discretely arranged (or be spaced) in the same band. For example, as illustrated in FIG. 2C, frequency channels CH11 and CH13 in use may be included in a first band BAND1, and may be spaced apart from each other. The frequency channels CH11 and CH13 in use in the non-contiguous intra-band carrier aggregation may be arranged relatively adjacent to each other as compared to those in the inter-band carrier aggregation of FIG. 2A, whereas the frequency channels CH11 and CH13 may be arranged over a wide frequency range as compared to those in the contiguous intra-band carrier aggregation of FIG. 2B. Accordingly, it may not be easy to separate the frequency channels CH11 and CH13 in use using one or two LNAs.

As an example for separating the frequency channels CH11 and CH13 in use in the non-contiguous intra-band carrier aggregation, as illustrated in FIG. 2C, a LNA 2c may output two output signals, that is, first and second output signals OUT1 and OUT2, from a first input signal IN1, and the first and second output signals OUT1 and OUT2 may be down-converted by frequencies f11 and f13 corresponding to the frequency channels CH11 and CH13, respectively. In this case, the INA 2c may generate one output signal by amplifying one input signal as illustrated in FIGS. 2A and 2B or may generate two output signals by amplifying one input signal as illustrated in FIG. 2C in order to support different types of carrier aggregation.

Figure 3A:
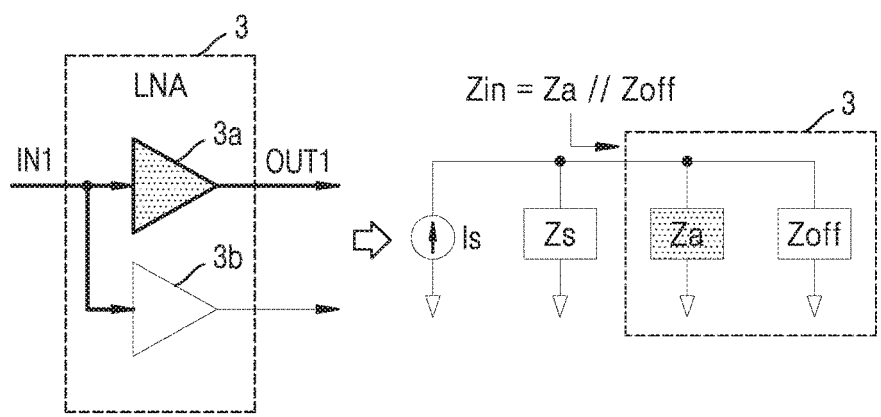
FIGS. 3A and 3B are views illustrating example structures for supporting the types of carrier aggregation illustrated in FIGS. 2A to 2C and equivalent circuits of the structures.
Figure 3B:
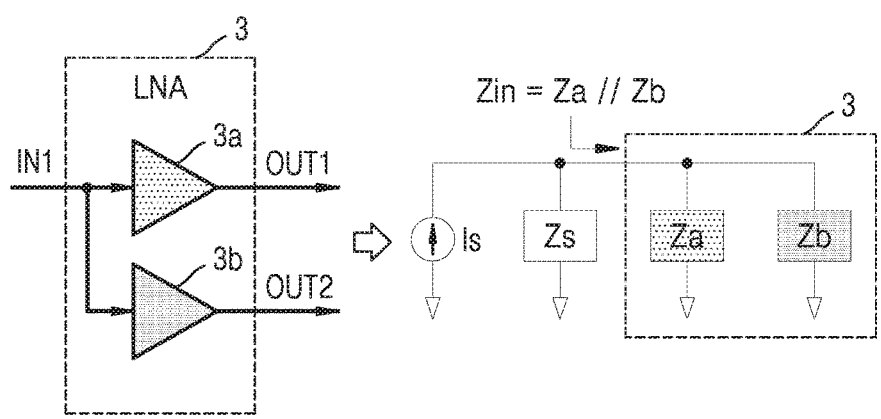

FIGS. 3A and 3B are views illustrating example structures for supporting the types of carrier aggregation illustrated in FIGS. 2A to 2C and equivalent circuits of the structures. A LNA 3 of FIGS. 3A and 3B may operate as illustrated in FIG. 3A or operate as illustrated in FIG. 3B according to the types of carrier aggregation. Referring to FIGS. 3A and 3B, the LNA 3 may include two amplifier stages 3a and 3b, and the amplifier stage 3b may be enabled or disabled according to an operation mode, that is, the type of carrier aggregation.

Referring to FIG. 3A, the LNA 3 may output one output signal by amplifying one input signal. For example, the LNA 3 may operate as illustrated in FIG. 3A in the inter-band carrier aggregation (e.g., in FIG. 2A) or in the contiguous intra-band carrier aggregation (e.g., in FIG. 2B). That is, the amplifier stage 3a may output a first output signal OUT1 by amplifying a first input signal IN1, and the amplifier stage 3b may be disabled and an output signal of the amplifier stage 3b may be in a floating state (or a high-impedance state). Accordingly, as illustrated in a right side of FIG. 3A, an input impedance Zin of the LNA 3 may match an impedance (i.e., Za//Zoff) in which an input impedance Za of the amplifier stage 3a and an input impedance Zoff of the amplifier stage 3b are connected in parallel. In FIG. 3A, the input impedance Zoff of the amplifier stage 3b may refer to an input impedance of the disabled amplifier stage 3b.

Referring to FIG. 3B, the LNA 3 may output two output signals by amplifying one input signal. For example, the LNA 3 may operate as illustrated in FIG. 3B in the non-contiguous intra-band carrier aggregation (e.g., in FIG. 2C). That is, the amplifier stage 3a may output a first output signal OUT1 by amplifying a first input signal IN1, and the amplifier stage 3b may output a second output signal OUT2 by amplifying the first input signal IN1. Accordingly, as illustrated in a right side of FIG. 3B, an input impedance Zin of the LNA 3 may match an impedance (i.e., Za//Zb) in which an input impedance Za of the amplifier stage 3a and an input impedance Zb of the amplifier stage 3b are connected in parallel. In FIG. 3B, the input impedance Za of the amplifier stage 3b may refer to an input impedance of the enabled amplifier stage 3b.

In the examples of FIGS. 3A and 3B, the input impedance Zin of the LNA 3 may vary significantly according to the operation mode (or the arrangement of the frequency channels or the setting of the carriers). When the LNA 3 operates as illustrated in FIG. 3A, a transistor of the amplifier stage 3b which receives the first input signal IN1 may be disabled in order to reduce interference in the operation of the amplifier stage 3a caused by the disabled amplifier stage 3b, and thus the input impedance Zoff of the disabled amplifier stage 3b may be greater than the input impedance Zb of the enabled amplifier stage 3b. As a result, the input impedance Zin of the LNA 3 may have a high input impedance Za//Zoff in the inter-band carrier aggregation or in the contiguous intra-band carrier aggregation, whereas the input impedance Zin of the LNA 3 may have a low input impedance Za//Zb in the non-contiguous intra-band carrier aggregation.

Due to the reduced input impedance Za//Zb in the non-contiguous intra-band carrier aggregation, the first input signal IN1 may be attenuated in the non-contiguous intra-band carrier aggregation as compared to the inter-band carrier aggregation or the contiguous intra-band carrier aggregation. Accordingly, when a gain of the LNA 3 (or any other amplifier following the LNA 3) is increased to compensate for the attenuation of the first input signal IN1 in the non-contiguous intra-band carrier aggregation, characteristics of the LNA 3 (e.g., linearity and/or bandwidth) may be degraded. Also, in the non-contiguous intra-band carrier aggregation, the LNA 3 may have degraded noise figure (NE) and reference signal received power (RSRP). As described below with reference to FIGS. 4, 5A, and 5B, a LNA according to an example embodiment of the inventive concepts may address this problem by reducing variation of an input impedance according to setting of a mode.

Figure 4:
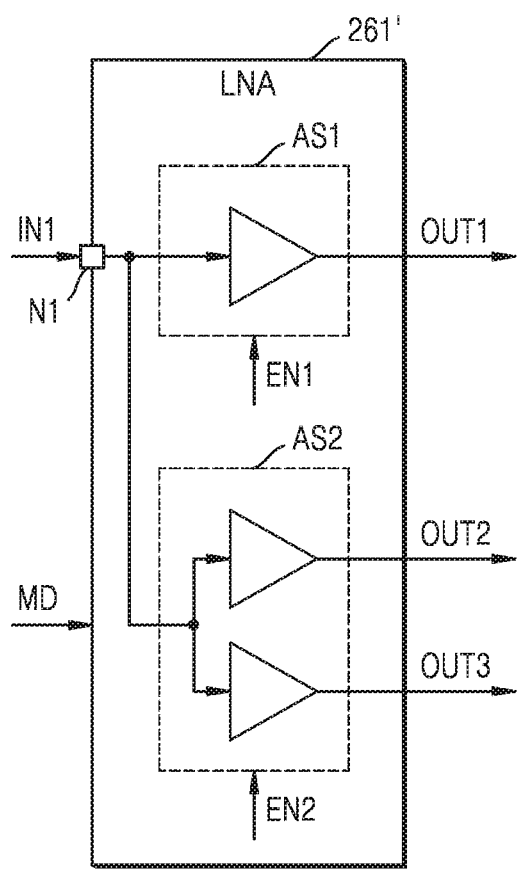
FIG. 4 is a block diagram illustrating an example of a low noise amplifier (LNA) of FIG. 1 according to an example embodiment of the inventive concepts.

FIG. 4 is a block diagram illustrating an example of the LNA 261 of FIG. 1 according to an example embodiment of the inventive concepts. As described above with reference to FIG. 1, a LNA 261' of FIG. 4 may include first and second amplifier stages AS1 and AS2. One of the first and second amplifier stages AS1 and AS2 may be enabled and the other may be disabled, according to a mode signal MD. A first input signal IN1 may be received through a first input terminal N1 of the LNA 261'. The first and second amplifier stages AS1 and AS2 may be connected to the first input terminal N1 and may receive the first input signal IN1 through the first input terminal N1.

The first amplifier stage AS1 may receive the first input signal IN1 and a first enable signal EN1 and output a first output signal OUT1. The first amplifier stage AS1 may be enabled in response to the activated first enable signal EN1, and may output the first output signal OUT1 by amplifying the first input signal IN1. On the other hand, the first amplifier stage AS1 may be disabled in response to the deactivated first enable signal EN1, and the first output signal OUT1 may be in a floating state (or a high-impedance state).

Similarly, the second amplifier stage AS2 may receive the first input signal IN1 and a second enable signal EN2 and output second and third output signals OUT2 and OUT3. The second amplifier stage AS2 may be enabled in response to the activated second enable signal EN2, and may output the second and third output signals OUT2 and OUT3 by amplifying the first input signal IN1. On the other hand, the second amplifier stage AS2 may be disabled in response to the deactivated second enable signal EN2, and the second and third output signals OUT2 and OUT3 may be in a floating state (or a high-impedance state).

As described above with reference to FIG. 1, the first and second amplifier stages AS1 and AS2 may be exclusively enabled. For example, the LNA 261' may activate one of the first and second enable signals EN1 and EN2 and deactivate the other based on the mode signal MD received from the controller 300. Accordingly, only one of the first and second amplifier stages AS1 and AS2 may be enabled, and the first input signal IN1 may be amplified by the first amplifier stage AS1 or by the second amplifier stage AS2.

According to the example embodiment of the inventive concepts, the LNA 261' may enable or disable the first and second amplifier stages AS1 and AS2 by controlling gate voltages of transistors included in the first and second amplifier stages AS1 and AS2. For example, the gate voltages of the transistors included in the first amplifier stage AS1 and the gate voltages of the transistors included in the second amplifier stage AS2 may be independently controlled, and the gate voltages may be inverted or non-inverted according to the first and second enable signals EN1 and EN2. In this specification, the inversion of the gate voltage of the transistor may refer to applying of a voltage that prevents a channel from being formed or to biasing of the gate of the transistor by such a voltage despite a signal applied to a gate of the transistor. For example, inversion of a gate voltage of an n-channel metal oxide semiconductor (NMOS) transistor may refer to applying of a low voltage (e.g., a ground voltage or a turn-off voltage) or to low voltage biasing, and inversion of a gate voltage of a p-channel metal oxide semiconductor (PMOS) transistor may refer to applying of a high voltage (e.g., a turn-on voltage) or to high voltage biasing. Also, in this specification, the non-inversion of the gate voltage of the transistor may refer to applying of the gate voltage that forms a channel in the transistor or to biasing of the gate of the transistor by such a voltage. For example, non-inversion of the gate voltage of the NMOS transistor may refer to applying of a high voltage (e.g., a turn-on voltage) or to high voltage biasing, and non-inversion of the gate voltage of the PMOS transistor may refer to applying of a low voltage (e.g., a ground voltage or a turn-off voltage) or to low voltage biasing.

According to the example embodiment of the inventive concepts, the LNA 261' may enable or disable the first and second amplifier stages AS1 and AS2 by controlling biases of the transistors included in the first and second amplifier stages AS1 and AS2. For example, the first amplifier stage AS1 enabled in response to the activated first enable signal EN1 may include a transistor which operates in a saturation region, whereas the first amplifier stage AS1 disabled in response to the deactivated first enable signal EN1 may include a transistor which is turned-off or operates in a linear region. Similarly, the second amplifier stage AS2 enabled in response to the activated second enable signal EN2 may include a transistor which operates in a saturation region, whereas the second amplifier stage AS2 disabled in response to the deactivated second enable signal EN2 may include a transistor which is turned-off or operates in a linear region. Also, according to the example embodiment of the inventive concepts, the LNA 261' may enable or disable the first and second amplifier stages AS1 and AS2 by controlling body voltages of the transistors included in the first and second amplifier stages AS1 and AS2. Hereinafter, the LNA 261' is described as enabling or disabling the first and second amplifier stages AS1 and AS2 by controlling the gate voltages of the transistors, but it will be understood that the scope of the inventive concepts is not limited thereto.

Figure 5A:
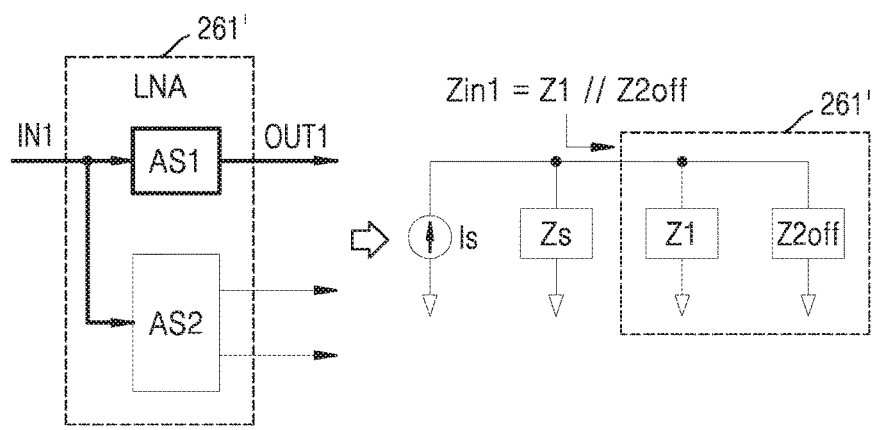
FIGS. 5A and 5B are views illustrating examples of operations of the LNA of FIG. 4 in accordance with an operation mode and equivalent circuits according to an example embodiment of the inventive concepts.
Figure 5B:
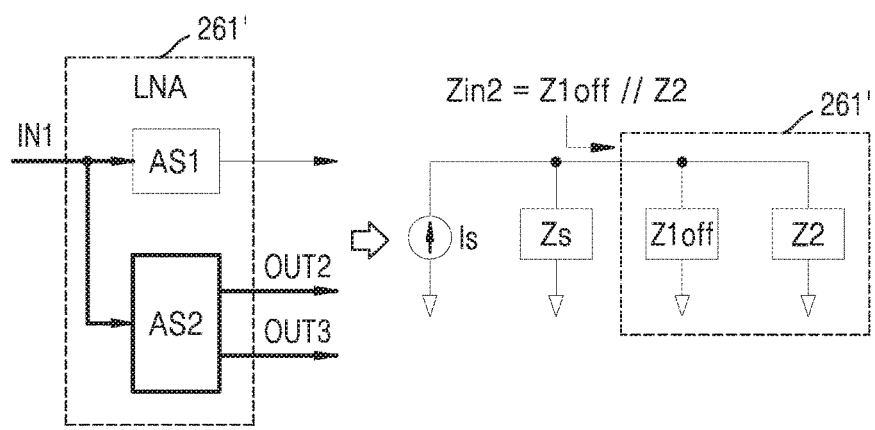

FIGS. 5A and 5B are views illustrating examples of operations of the LNA 261' of FIG. 4 in accordance with the operation mode and equivalent circuits according to an example embodiment of the inventive concepts. Specifically, the examples of FIGS. 5A and 5B may correspond to the comparative examples of FIGS. 3A and 3B, respectively.

Referring to FIG. 5A, a LNA 261' may output one output signal by amplifying one input signal in a first mode. For example, the LNA 261' may operate as illustrated in FIG. 5A in the first mode, for example, in the inter-band carrier aggregation (e.g., in FIG. 2A) or in the contiguous intra-band carrier aggregation (e.g., in FIG. 2B). That is, an enabled first amplifier stage AS1 may output a first output signal OUT1 by amplifying a first input signal IN1, and output signals of a disabled second amplifier stage AS2 may be in a floating state (or a high-impedance state). Accordingly, in the first mode, an input impedance Zin1 of the LNA 261' may match an impedance (i.e., Z1//Z2off) in which an input impedance Z1 of the enabled first amplifier stage AS1 and an input impedance Z2off of the disabled second amplifier stage AS2 are connected in parallel.

Referring to FIG. 5B, a LNA 261' may output two output signals by amplifying one input signal in a second mode. For example, the LNA 261' may operate as illustrated in FIG. 5B in the second mode, for example, in the non-contiguous intra-band carrier aggregation (e.g., in FIG. 2C). That is, output signals of a disabled first amplifier stage AS1 may be in a floating state (or a high-impedance state), and an enabled second amplifier stage AS2 may output second and third output signals OUT2 and OUT3 by amplifying a first input signal IN1. Accordingly, in the second mode, an input impedance Zin2 of the LNA 261' may match an impedance (i.e., Z1off//Z2) in which an input impedance Z1off of the disabled first amplifier stage AS1 and an input impedance Z2 of the enabled second amplifier stage AS2 are connected in parallel.

The LNA 261' may be designed to reduce a difference between the input impedance Zin1 in the first mode and the input impedance Zin2 in the second mode. That is, the first and second amplifier stages AS1 and AS2 may be designed to reduce a difference between the impedance Z1//Z2off which is the input impedance Zin1 in the first mode and the impedance Z1off//Z2 which is the input impedance Zin2 in the second mode. In the comparative examples illustrated in FIGS. 3A and 3B, unlike the case in which the input impedance Zin of the LNA 3 is significantly changed due to a difference between the input impedance Zb of the enabled amplifier stage 3b and the input impedance Zoff of the disabled amplifier stage 3b, since the first and second amplifier stages AS1 and AS2 may be exclusively enabled as illustrated in FIGS. 5A and 5B, the input impedance of the LNA 261' in the first mode and the input impedance of the LNA 261' in the second mode may have a small difference therebetween or may be substantially the same. Accordingly, the first input signal IN1 may be input to the first amplifier stage AS1 or the second amplifier stage AS2 according to the substantially constant attenuation ratio in the first and second modes. Hereinafter, various examples of the LNA according to example embodiments of the inventive concepts will be described with reference to FIGS. 6B to 11B, but it will be understood that the scope of the inventive concepts is not limited to the examples to be described.

Figure 6A:
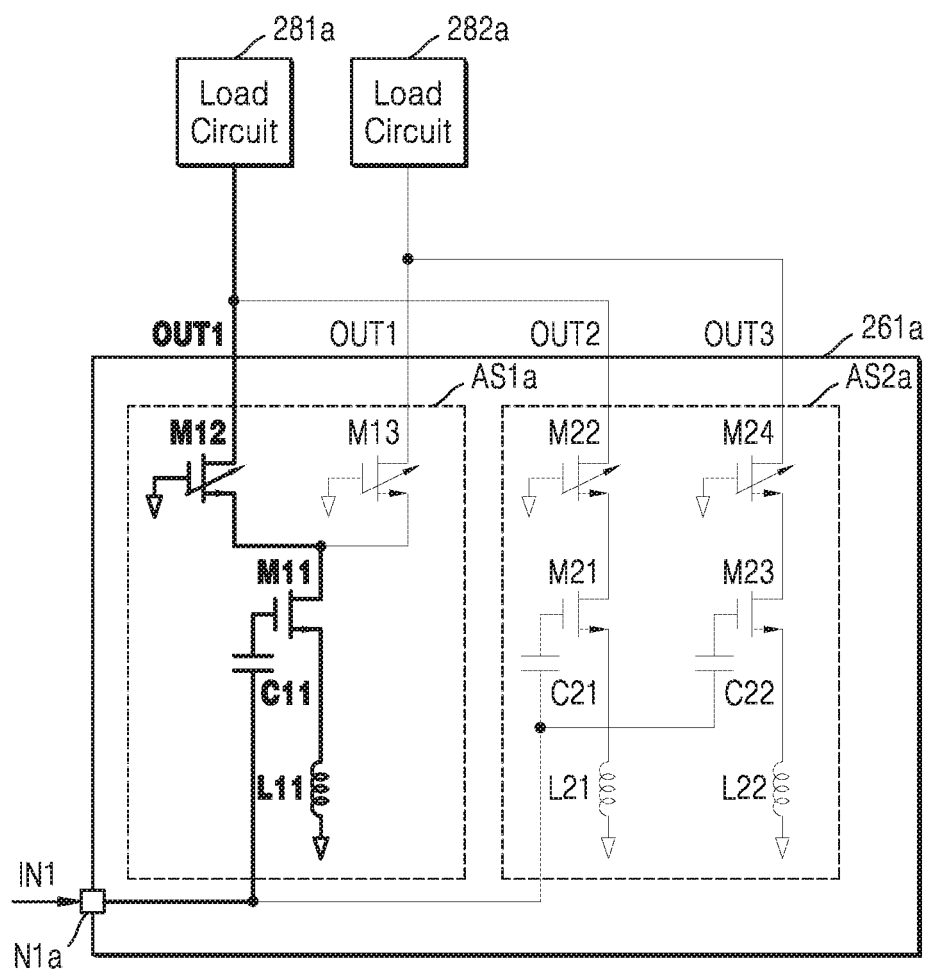
FIGS. 6A to 6C are views illustrating examples of the LNA of FIG. 1 according to an example embodiment of the inventive concepts.
Figure 6B:
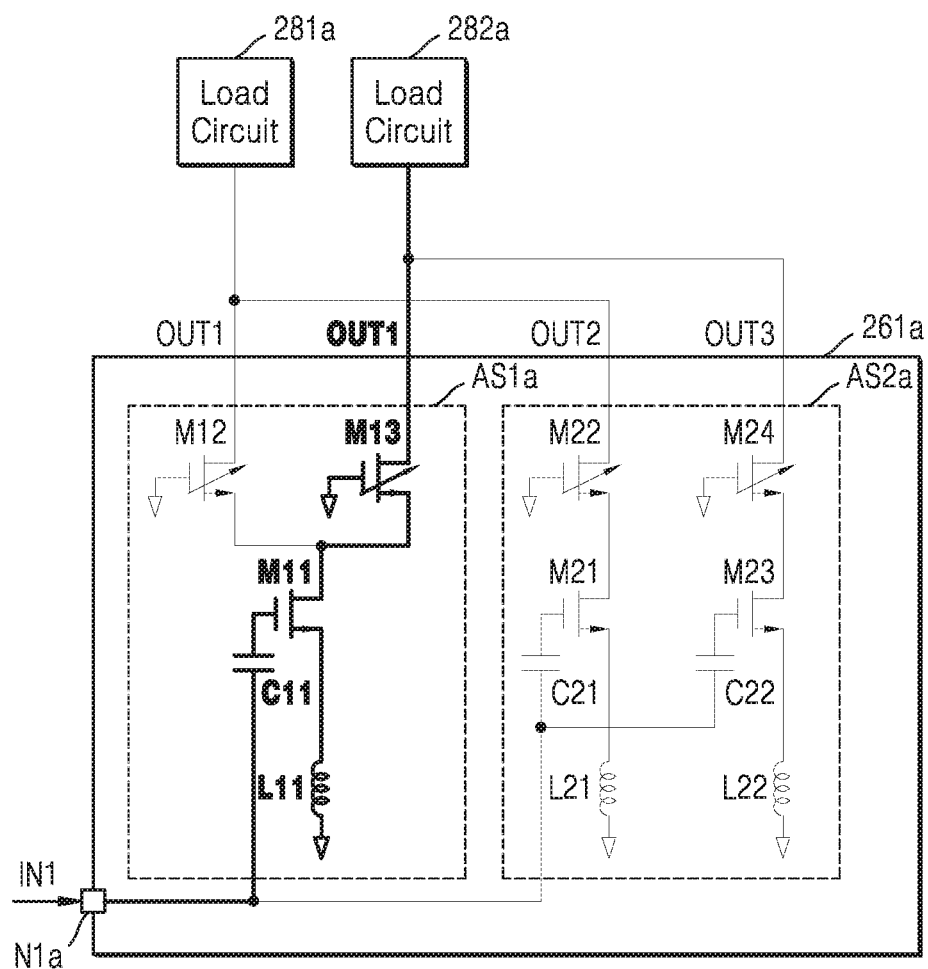
Figure 6C:
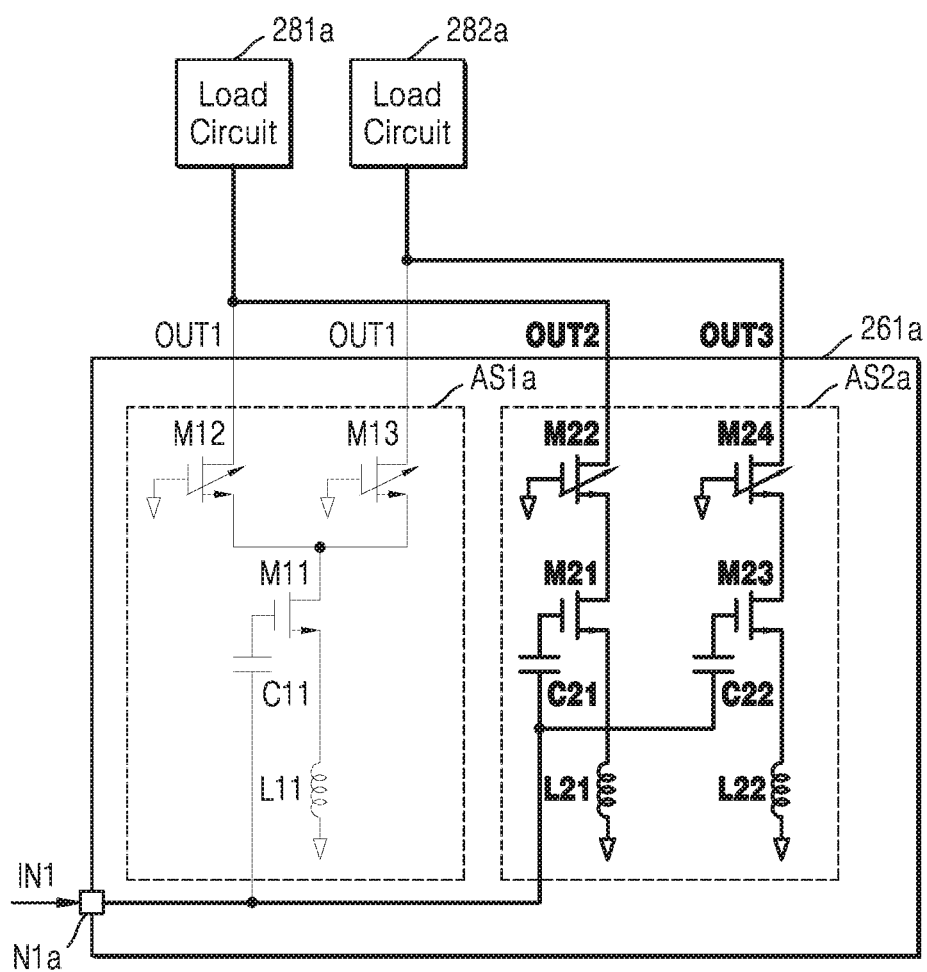

FIGS. 6A to 6C are views illustrating examples of the LNA 261 of FIG. 1 according to an example embodiment of the inventive concepts. Specifically, FIGS. 6A to 6C are schematic diagrams of LNAs 261a having the same structure and each illustrate examples of operations of the LNAs 261a according to an operation mode. Elements and lines related to amplification of a first input signal IN1 are illustrated in bold in FIGS. 6A to 6C. As illustrated in FIGS. 6A to 6C, the LNA 261a may include first and second amplifier stages AS1a and AS2a, which are connected to an input terminal N1a and receive the first input signal IN1 from the input terminal N1a.

The first amplifier stage AS1a may include an input capacitor C11, an input transistor M11, a degeneration inductor L11, and cascode transistors M12 and M13. The input capacitor C11 may be arranged between the input terminal N1a and a gate of the input transistor M11, and the degeneration inductor L11 may be arranged between a source of the input transistor M11 and a ground. Sources of the cascode transistors M12 and M13 may be connected to a drain of the input transistor M11, and drains of the cascode transistors M12 and M13 may be respectively connected to output ports, which are exposed to the outside of the LNA 261a and output a first output signal OUT1. Although not illustrated, the first amplifier stage AS1a may further include a sub-circuit for biasing a gate voltage of the input transistor M11 between the input capacitor C11 and the gate of the input transistor M11, and the gate voltage of the input transistor M11 may be inverted or non-inverted by the sub-circuit.

The cascode transistors M12 and M13 may adjust a gain of the first amplifier stage AS1a, that is, a ratio of the first input signal IN1 to the first output signal OUT1, by providing a bias to the input transistor M11 and simultaneously controlling the bias. For example, in FIGS. 6A to 6C, each of the cascode transistors M12 and M13 may include a transistor for providing a bias to the input transistor M11 and a transistor for controlling the bias. Controlling the gain of the first amplifier stage AS1a using the cascode transistors M12 and M13 in this way may be referred to as automatic gain control (AGC). Gains of cascode transistors M12, M13, M22, and M24 illustrated in FIG. 6A may be independently controlled.

The second amplifier stage AS2a may include input capacitors C21 and C22, input transistors M21 and M23, degeneration inductors L21 and L22, and cascode transistors M22 and M24. The input capacitor C21, the input transistor M21, the degeneration inductor L21, and the cascode transistor M22 may be arranged similar to those of the first amplifier stage AS1a, and a drain of the cascode transistor M22 may be connected to an output port, which may be exposed to the outside of the LNA 261a and outputs a second output signal OUT2. Also, the input capacitor C22, the input transistor M23, the degeneration inductor L22, and the cascode transistor M24 may be arranged, and a drain of the cascode transistor M24 may be connected to an output port, which may be exposed to the outside of the LNA 261a and outputs a third output signal OUT3. Also, although not illustrated, the second amplifier stage AS2a may include sub-circuits for biasing gate voltages of the input transistors M21 and M23.

As illustrated in FIGS. 6A to 6C, load circuits 281a and 282a may be connected to the LNA 261a. The first load circuit 281a may receive the first output signal OUT1 or the second output signal OUT2, and the second load circuit 282a may receive the first output signal OUT1 or the third output signal OUT3. As illustrated in FIGS. 6A to 6C, outside the LNA 261a, the ports which output the first output signal OUT1 may be respectively connected to the ports which output the second and third output signals OUT2 and OUT3.

Referring to FIGS. 6A and 6B, in a first mode, the LNA 261a may enable the first amplifier stage AS1a and disable the second amplifier stage AS2a. Accordingly, a gate voltage of the input transistor M11 of the first amplifier stage AS1a may be non-inverted, and gate voltages of the transistors M21 to M24 of the second amplifier stage AS2a may be inverted. Since each of the load circuits 281a and 282a may be shared by the LNA 261a and another LNA included in the LNAs 260 of FIG. 1, the load circuit which receives the first output signal OUT1 output from the enabled first amplifier stage AS1a may be varied. To this end, as illustrated in FIGS. 6A and 6B, the first amplifier stage AS1a may include two cascode transistors M12 and M13 which share the input transistor M11. One of the cascode transistors M12 and M13 may be enabled and the other may be disabled in the first mode. For example, as illustrated in FIG. 6A, a gate voltage of the cascode transistor M12 may be non-inverted and a gate voltage of the cascode transistor M13 may be inverted so that the first load circuit 281a receives the first output signal OUT1. On the other hand, as illustrated in FIG. 6B, a gate voltage of the cascode transistor M12 may be inverted and a gate voltage of the cascode transistor M13 may be non-inverted so that the second load circuit 282a receives the first output signal OUT1. To this end, each of the gate voltages of the cascode transistors M12 and M13 may be independently controlled.

Referring to FIG. 6C, in a second mode, a LNA 261a may disable a first amplifier stage AS1a and enable a second amplifier stage AS2a. Accordingly, gate voltages of transistors M11 to M13 included in the first amplifier stage AS1a may be inverted and gate voltages of transistors M21 to M24 included in the second amplifier stage AS2a may be non-inverted. The first and second load circuit 281a and 282a may receive second and third output signals OUT2 and OUT3 from the second amplifier stage AS2a.

Figure 7A:
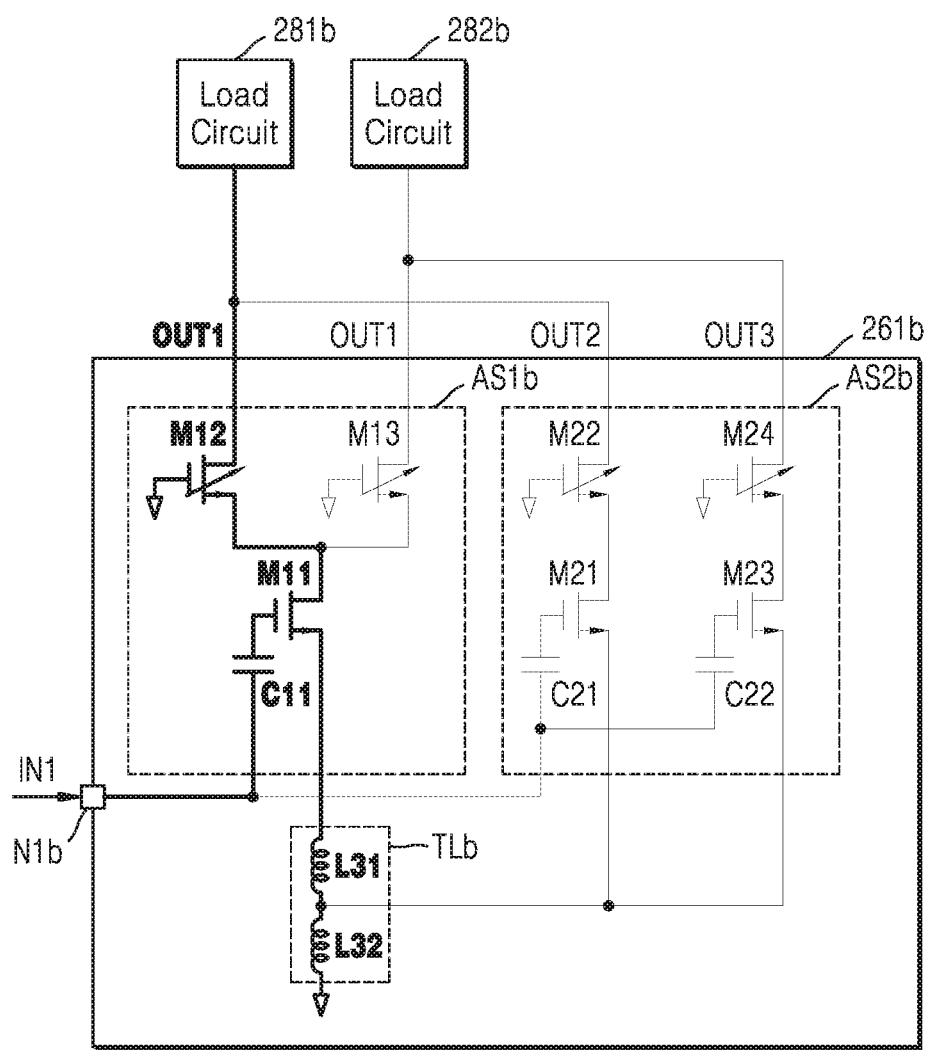
FIGS. 7A to 7C are views illustrating examples of the LNA of FIG. 1 according to an example embodiment of the inventive concepts.
Figure 7B:
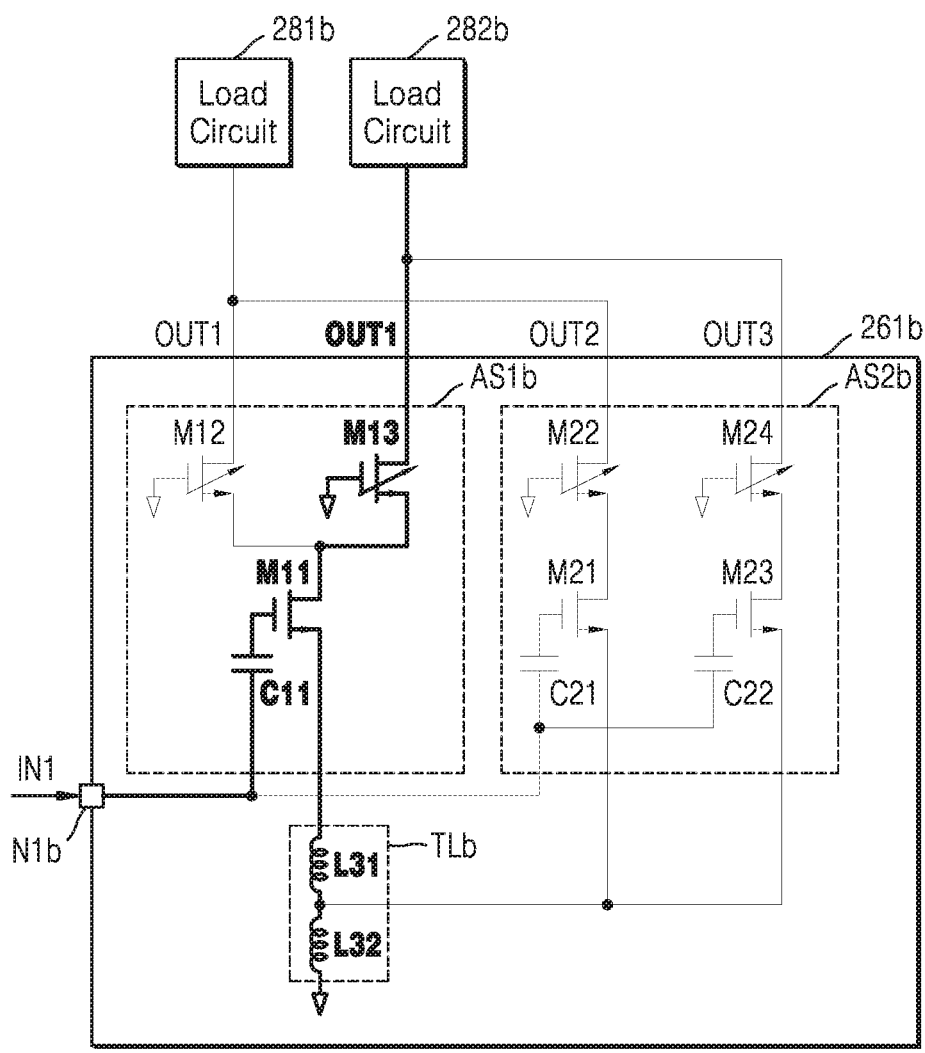
Figure 7C:
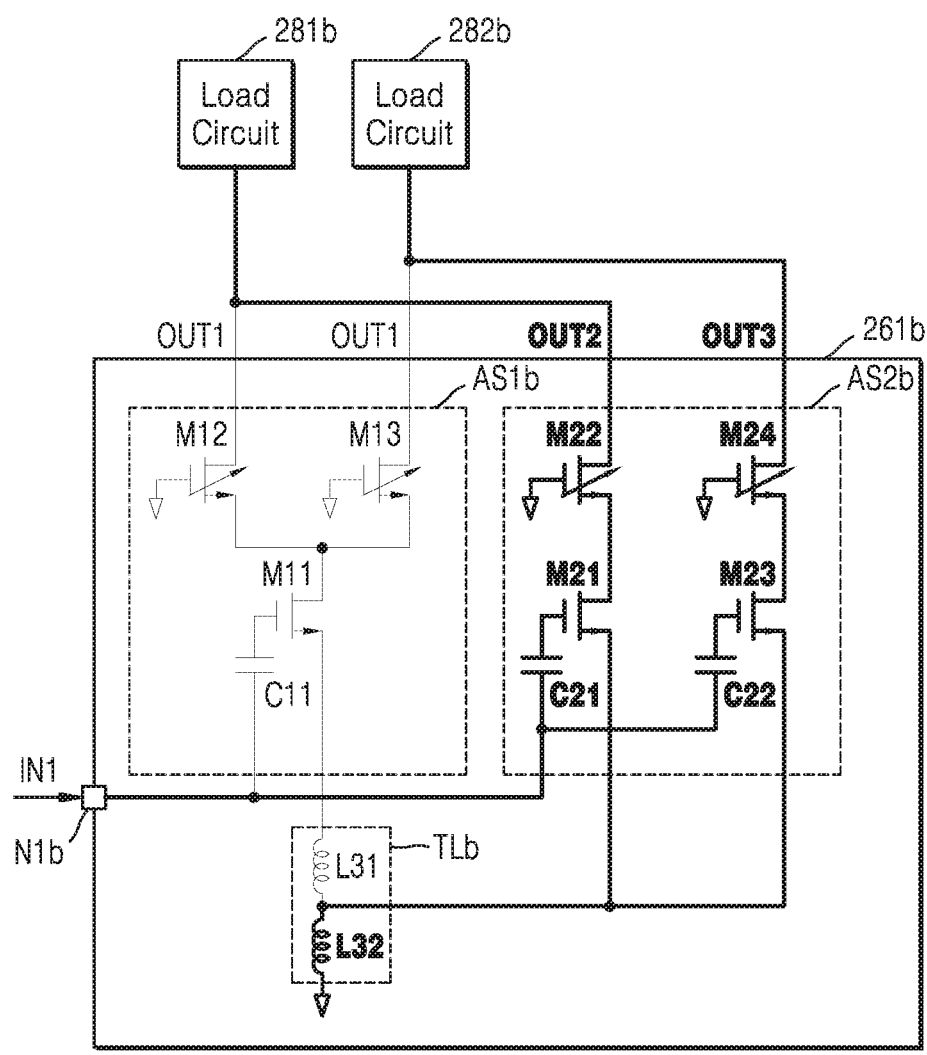

FIGS. 7A to 7C are views illustrating examples of the LNA 261 of FIG. 1 according to an example embodiment of the inventive concepts. Specifically, FIGS. 7A to 7C are schematic diagrams of LNAs 261b having the same structure and each illustrate examples of operations of the LNAs 261b according to an operation mode. Elements and lines related to the amplification of a first input signal 1N1 are illustrated in bold in FIGS. 7A to 7C. Similar to the LNAs 261a of FIGS. 6A to 6C, the LNA 261b may include first and second amplifier stages AS1b and AS2b, which are connected to an input terminal N1b and receive the first input signal IN1 from the input terminal N1b. Hereinafter, description of FIGS. 7A to 7C, which is the same as the description of FIGS. 6A to 6C, will be omitted.

According to the example embodiment of the inventive concepts, the LNA 261b may include a tapped inductor TLb, and the tapped inductor TLb may be shared by the first and second amplifier stages AS1b and AS2b as a degeneration inductor. That is, sources of input transistors M11, M21, and M23 of the first and second amplifier stages AS1b and AS2b may be connected to the tapped inductor TLb. For example, as illustrated in FIGS. 7A to 7C, the source of the input transistor M11 of the first amplifier stage AS1b may be connected to another end of the tapped inductor TLb having one end connected to a ground, whereas the sources of the input transistors M21 and M23 of the second amplifier stage AS2b may be connected to a tap of the tapped inductor TLb. Accordingly, costs for the degeneration inductor in the LNA 261b, for example, a space and the like, may be saved.

Referring to FIGS. 7A and 7B, in a first mode, the LNA 261b may enable the first amplifier stage AS1b. For example, as illustrated in FIG. 7A, the input transistor M11 and a cascode transistor M12 may be enabled and a cascode transistor M13 may be disabled. As illustrated in FIG. 7B, the first input transistor M11 and the cascode transistor M13 may be enabled and the cascode transistor M12 may be disabled. Also, in the first mode, the LNA 261b may disable the second amplifier stage AS2b and disable transistors M21 to M24 of the second amplifier stage AS2b. As illustrated in FIGS. 7A and 7B, both of inductors L31 and L32 of the tapped inductor TLb may function as a degeneration inductor of the first amplifier stage AS1b in the first mode.

Referring to FIG. 7C, in a second mode, the LNA 261b may disable the first amplifier stage AS1b and disable the transistors M11 to M13 included in the first amplifier stage AS1b. Also, in the second mode, the LNA 261b may enable the second amplifier stage AS2b and enable the transistors M21 to M24 of the second amplifier stage AS2b. As illustrated in FIG. 7C, in the second mode, the inductor L32 of the inductors L31 and L32 of the tapped inductor TLb may function as a degeneration inductor of the second amplifier stage AS2b.

Figure 8A:
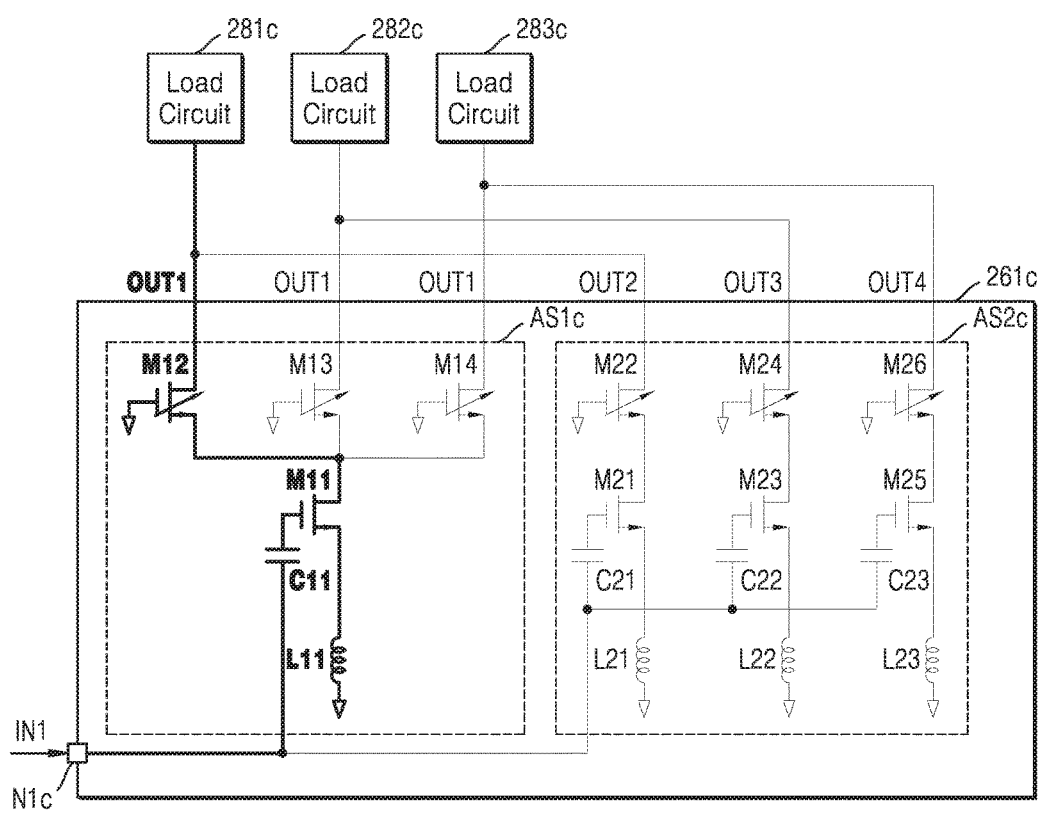
FIGS. 8A to 8C are views illustrating examples of the LNA of FIG. 1 according to an example embodiment of the inventive concepts.
Figure 8B:
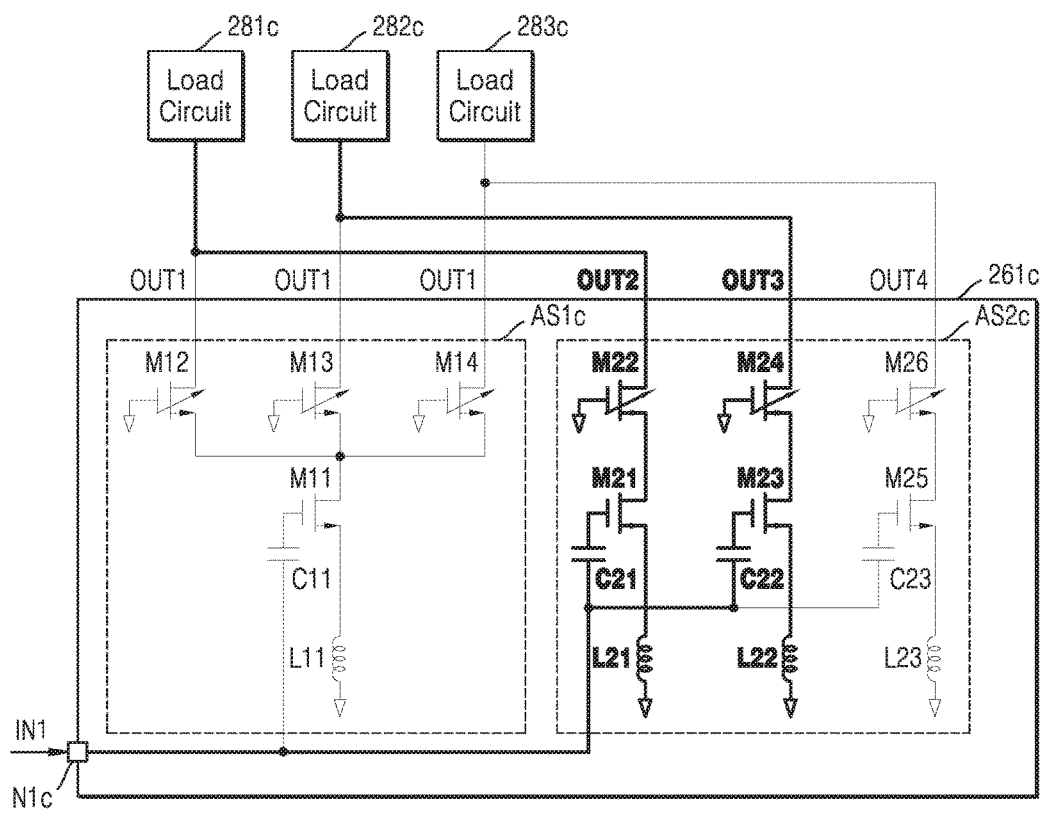
Figure 8C:
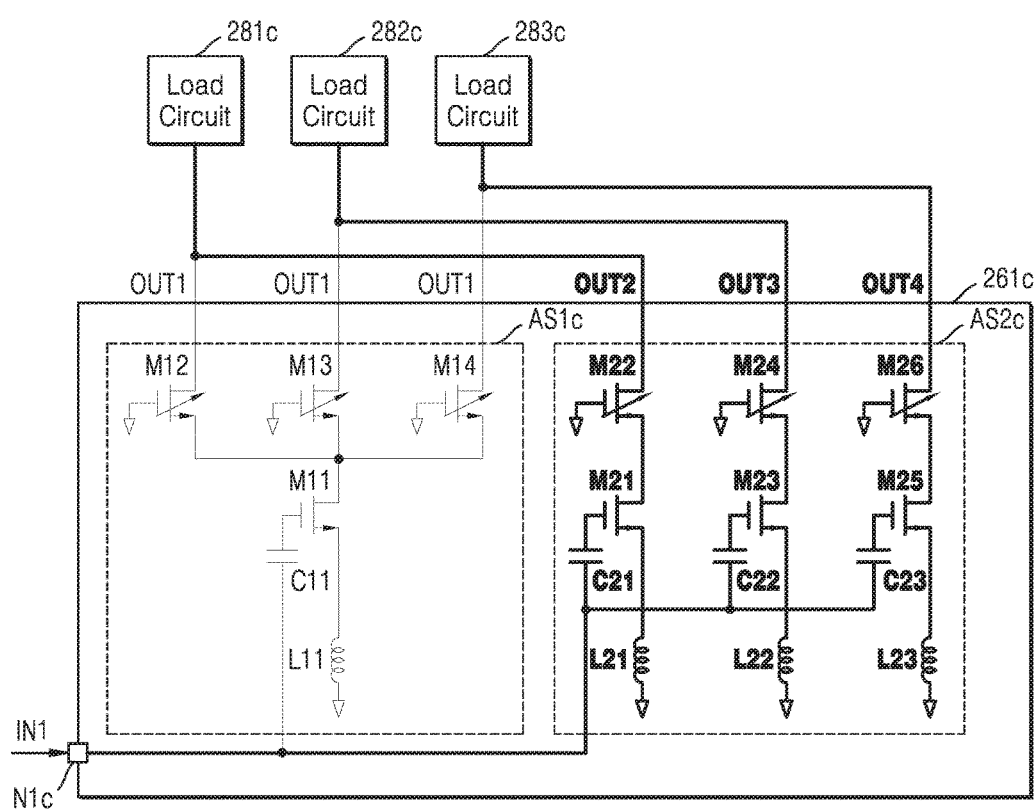

FIGS. 8A to 8C are views illustrating examples of the LNA 261 of FIG. 1 according to an example embodiment of the inventive concepts. Specifically, FIGS. 8A to 8C are schematic diagrams of LNAs 261c having the same structure and each illustrate examples of operations of the LNAs 261c according to an operation mode. Elements and lines related to the amplification of a first input signal IN1 are illustrated in bold in FIGS. 8A to 8C. Similar to the LNAs 261a of FIGS. 6A to 6C, the LNA 261c may include first and second amplifier stages AS1c and AS2c, which are connected to an input terminal N1c and receive the first input signal IN1 from the input terminal N1c. Hereinafter, description of FIGS. 8A to 8C, which is the same as the description of FIGS. 6A to 6C, will be omitted.

According to the example embodiment of the inventive concepts, the LNA 261c may output at least one output signal of three output signals by amplifying the first input signal IN1. That is, the LNA 261c may output three output signals OUT2, OUT3, and OUT4, for example, by amplifying the first input signal IN1 in a third mode as compared to the LNA 261a of FIGS. 6A to 6C. For example, when the first input signal IN1 (e.g., included in the same band) includes three carriers, the LNA 261c may output three output signals OUT2, OUT3, and OUT4 and provide the output signals OUT2, OUT3, and OUT4 to three load circuits 281c, 282c, and 283c, respectively, in order to separate signals corresponding to the three carriers. To this end, as illustrated in FIGS. 8A to 8C, the first amplifier stage AS1c may include an input transistor M11 and three cascode transistors M12 to M14 which share the input transistor M11, and the second amplifier stage AS2c may include three input transistors M21, M23, and M25 and three cascode transistors M22, M24, and M26.

Referring to FIG. 8A, in a first mode, the LNA 261c may output one output signal (i.e., OUT1) by amplifying the first input signal IN1. To this end, the LNA 261c may enable the first amplifier stage AS1c and disable the second amplifier stage AS2c. For example, as illustrated in FIG. 8A, the input transistor M11 and the cascode transistor M12 may be enabled and the other cascode transistors M13 and M14 may be disabled. The first load circuit 281c may receive a first output signal OUT1 from the cascode transistor M12. Although not illustrated, in the first mode, the cascode transistor M13 may be enabled and thus the second load circuit 282c may receive the first output signal OUT1, or the cascode transistor M14 may be enabled and thus the third load circuit 283c may receive the first output signal OUT1. Also, in the first mode, the LNA 261c may disable the transistors M21 to M26 included in the second amplifier stage AS2c.

Referring to FIG. 8B, in a second mode, the LNA 261c may output two output signals (e.g., OUT2 and OUT3) by amplifying the first input signal IN1. To this end, the LNA 261c may disable the first amplifier stage AS1c and enable the second amplifier stage AS2c. For example, as illustrated in FIG. 8B, the input transistors M21 and M23 and the cascode transistors M22 and M24 may be enabled, and the input transistor M25 and the other cascode transistor M26 may be disabled. The first and second load circuits 281c and 282c may receive the second and third output signals OUT2 and OUT3 from the cascode transistors M22 and M24, respectively. Although not illustrated, in the second mode, the input transistors M21 and M25 and the cascode transistors M22 and M26 may be enabled and thus the first and third load circuits 281c and 283c may receive the second and fourth output signals OUT2 and OUT4, respectively, or the input transistors M23 and M25 and the cascode transistors M24 and M26 may be enabled and thus the second and third load circuits 282c and 283c may receive the third and fourth output signals OUT3 and OUT4, respectively. Also, in the second mode, the LNA 261c may disable the transistors M11 to M14 included in the first amplifier stage AS1c.

Referring to FIG. 8C, in a third mode, the LNA 261c may output three output signals OUT2 to OUT4 by amplifying the first input signal IN1. To this end, the LNA 261c may disable the first amplifier stage AS1c and enable the second amplifier stage AS2c. For example, as illustrated in FIG. 8C, the transistors M11 to M14 included in the first amplifier stage AS1c may be disabled, and the transistors M21 to M26 included in the second amplifier stage AS2c may be enabled. The first to third load circuits 281c to 283c may receive the second to fourth output signals OUT2 to OUT4 from the cascode transistors M22 to M26, respectively. The experimental results illustrate that a difference between the input impedances of the second amplifier stage AS2c in the second and third modes is small.

Figure 9A:
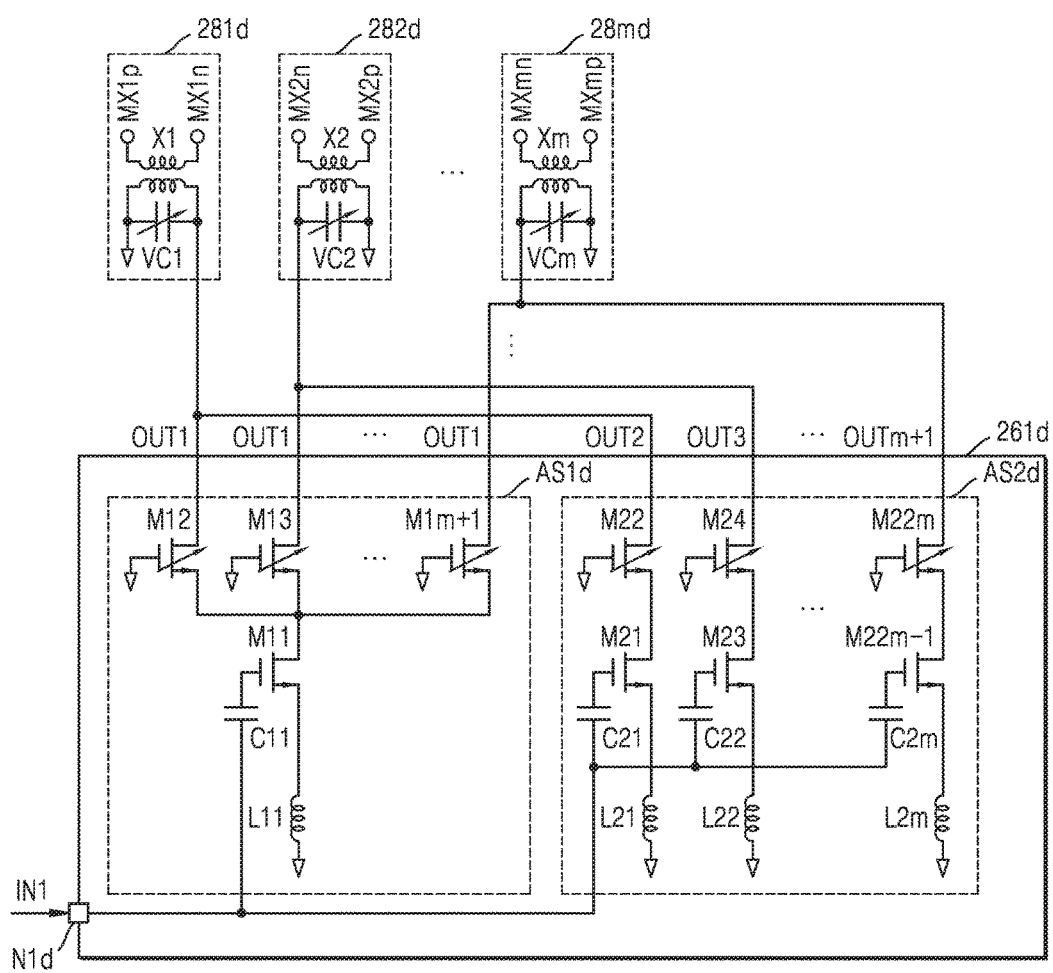
FIGS. 9A and 9B are views illustrating examples of the LNA and load circuits of FIG. 1 according to example embodiments of the inventive concepts.
Figure 9B:
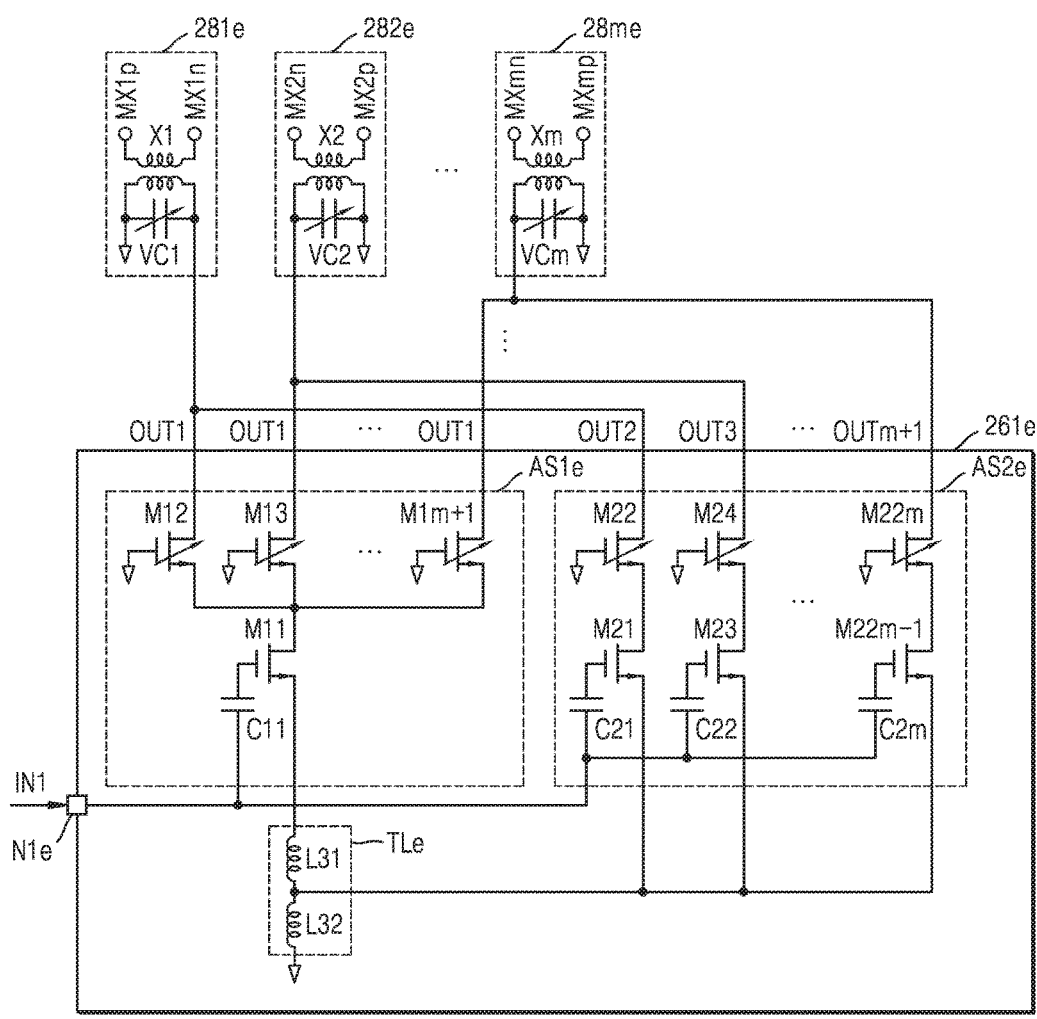

FIGS. 9A and 9B are views illustrating examples of the LNA 261 and the load circuits 280 of FIG. 1 according to example embodiments of the inventive concepts. Specifically, FIGS. 9A and 9B illustrate LNAs 261d and 261e which output at least one of m output signals by amplifying a first input signal IN1 (m is an integer greater than 2). Similar to the LNAs 261c of FIGS. 8A to 8C, the LNAs 261d and 261e may include first amplifier stages AS1d and AS1e and second amplifier stages AS2d and AS2e, which are connected to input terminals N1d and N1e and receive the first input signal IN1 from the input terminals N1d and N1e, respectively. Hereinafter, description of FIGS. 9A and 9B, which is the same as the description of FIGS. 8A to 8C, will be omitted.

According to the example embodiment of the inventive concepts, the load circuits 280 of FIG. 1 may include a plurality of transformers, and the output signals OUTs of the LNA 261 of FIG. 1 may be respectively transferred to the plurality of transformers. The transformer may include a primary coil which receives the output signal of the LNA 261 and a secondary coil which provides a differential output signal derived from the output signal, and thus may function as a passive balance and unbalance (balun). The balun may refer to a circuit which converts one phase signal into a differential phase signal. For example, as illustrated in FIG. 9A, the first load circuit 281d may include a transformer X1 including a primary coil, which receives a first output signal OUT1 or a second output signal OUT2 from the LNA 261d, and a secondary coil, which provides first differential signals MX1n and MX1p. The first load circuit 281d may further include a mixer which receives the first differential signals MX1n and MX1p subsequent to the transformer X1. Also, the first load circuit 281d may include a variable capacitor VC1 connected in parallel to the primary coil of the transformer X1, and a resonance frequency may be adjusted by the variable capacitor VC1.

Referring to FIG. 9A, the first amplifier stage AS1d of the LNA 261d may include cascode transistors M12 to M1m+1 which share an input transistor M11, and the second amplifier stage AS2d may include m input capacitors C21 to C2m, m input transistors M21, M23, . . . , M22m−1, m degeneration inductors L21 to L2m, and m cascode transistors M22, M24, . . . , M22m. Similar to that described above with reference to FIGS. 8A to 8C, one of m cascode transistors M12 to M1m+1 of the first amplifier stage AS1d may be enabled in a first mode in which one output signal (i.e., OUT1) is output, and at least two of the in input transistors M21, M23, . . . , M22m−1 and at least two of them cascode transistors M22, M24, . . . , M22m of the second amplifier stage AS2d may be enabled in modes in which two or more output signals are output.

Referring to FIG. 9B, the LNA 261e may include a tapped inductor TLe, and may be shared by the first and second amplifier stages AS1e and AS2e as a degeneration inductor. That is, sources of the input transistors M11, M21, M23, . . . , M22m−1 of the first and second amplifier stages AS1e and AS2e may be connected to the tapped inductor TLe. For example, as illustrated in FIG. 9B, the source of the input transistor M11 of the first amplifier stage AS1e may be connected to another end of the tapped inductor TLe having one end connected to a ground, and the sources of the input transistors M21, M23, . . . , M22m−1 of the second amplifier stage AS2e may be connected to a tap of the tapped inductor TLe. Accordingly, costs for the degeneration inductor in the LNA 261e, for example, a space and the like, may be saved.

One of the m cascode transistors M12 to M1m+1 of the first amplifier stage AS1e may be enabled in the first mode in which one output signal (i.e., OUT1) is output, and both of the inductors L31 and L32 of the tapped inductor TLe may function as a degeneration inductor of the first amplifier stage AS1e. Also, at least two of the m input transistors M21, M23, . . . , M22m−1 of the second amplifier stage AS2e and at least two of the m cascode transistors M22, M24, . . . , M22m may be enabled in the modes in which two or more output signals are output, and the inductor L32 of the tapped inductor TLe may function as a degeneration inductor of the second amplifier stage AS2e.

Figure 10A:
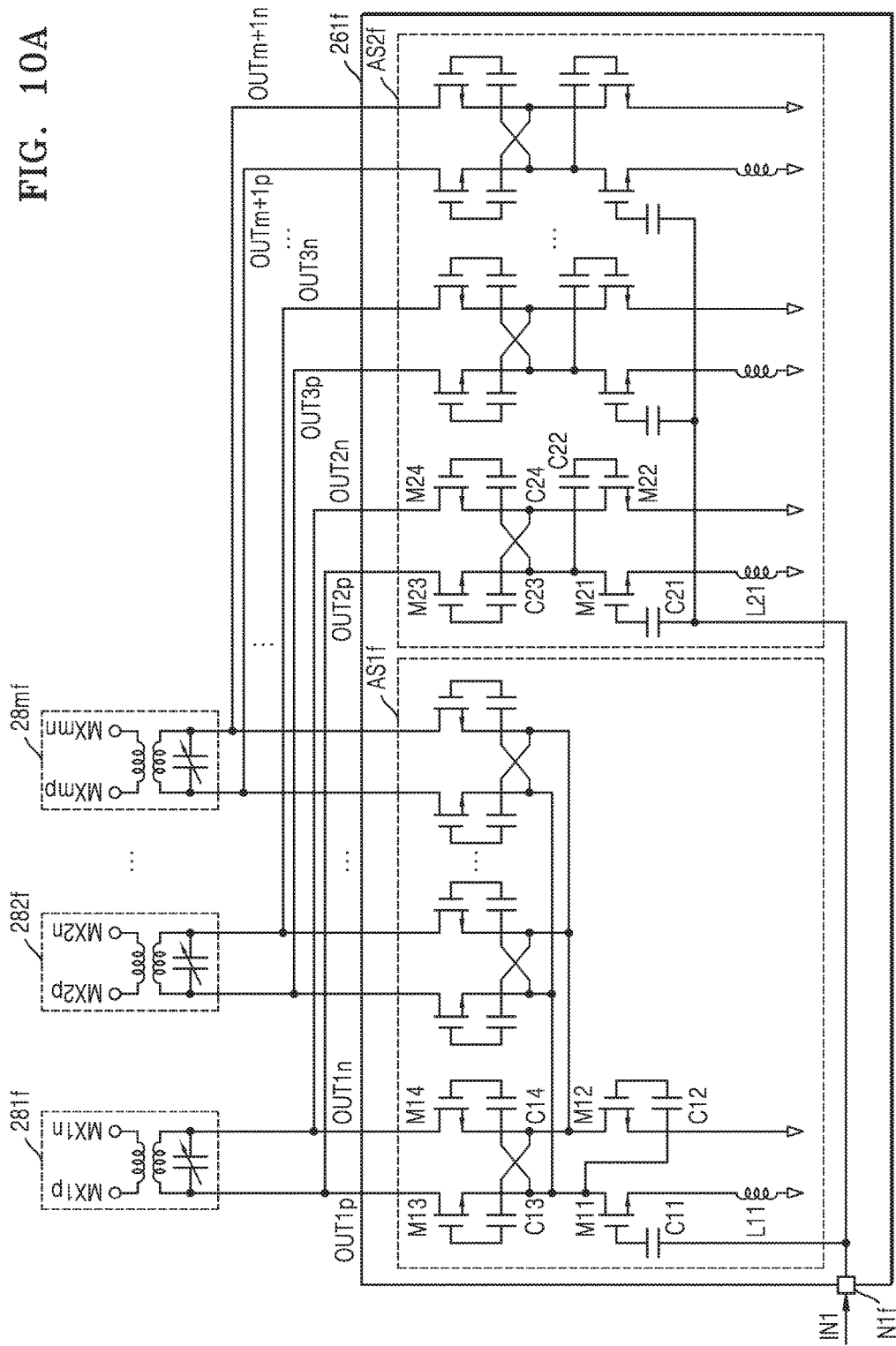
FIGS. 10A and 10B are views illustrating examples of the LNA and the load circuits of FIG. 1 according to example embodiments of the inventive concepts.
Figure 10B:
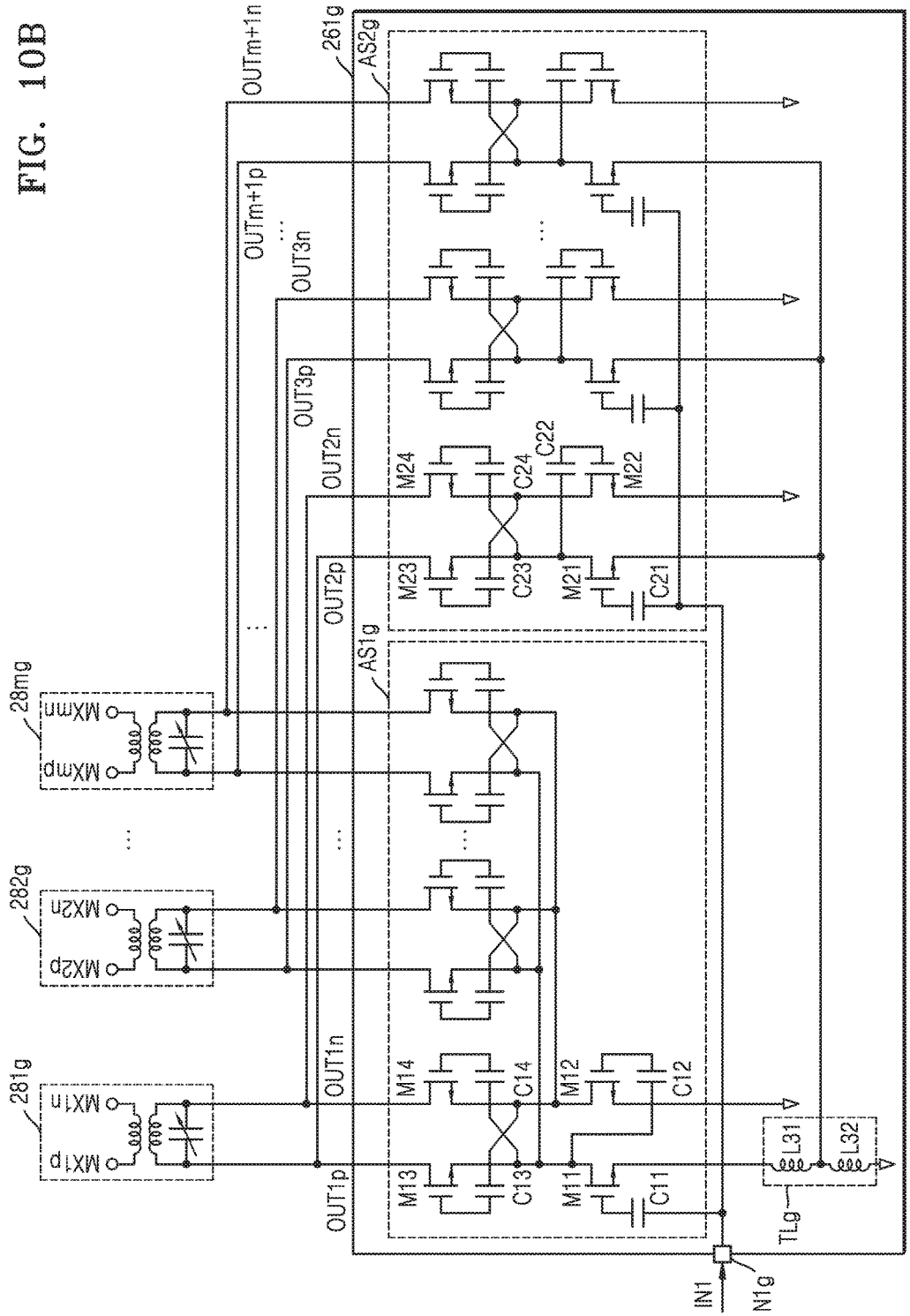

FIGS. 10A and 10B are views illustrating examples of the LNA 261 and the load circuits 280 of FIG. 1 according to example embodiments of the inventive concepts. Specifically, FIGS. 10A and 10B illustrate load circuits including LNAs 261f and 261g which output at least one of m output signals, which is a differential signal, by amplifying a first input signal IN1 and a transformer. Similar to the LNAs 261d and 261e of FIGS. 9A and 9B, the LNAs 261f and 261g may include first amplifier stages AS1f and AS1g and second amplifier stages AS2f and AS2g, which are connected to input terminals N1f and N1g and receive the first input signal IN1 from the input terminals N1f and N1g, respectively. Hereinafter, description of FIGS. 10A and 10B, which is the same as the description of FIGS. 9A and 9B, will be omitted.

According to the example embodiment of the inventive concepts, the LNA 261 of FIG. 1 may provide an output signal as a differential signal, and each of the load circuits 280 may provide a differential signal derived from the output signal which is the differential signal. To this end, the LNA 261 may include an active balun. For example, as illustrated in FIG. 10A, the first amplifier stage AS1f of the LNA 261f may include an input capacitor C11 and an input transistor M11, and a capacitor C12 for amplifying an output of the input transistor M11, that is, a signal of a drain of the input transistor M11, and a transistor M12. Outputs of the input transistor M11 and the transistor M12 may be transferred to capacitors C13 and C14 and transistors M13 and M14, and first output signals OUT1p and OUT1n which are differential signals may be output. That is, the capacitors C13 and C14 and the transistors M13 and M14 may be one circuitry for outputting the first output signals OUT1p and OUT1n. Also, the second amplifier stage AS2f of the LNA 261f may provide second output signals OUT2p and OUT2n, which are differential signals, by amplifying the first input signal IN1 by using an input capacitor C21, an input transistor M21, degeneration inductors L21 and L22, capacitors C22, C23, and C24, and transistors M22, M23, and M24. That is, the input capacitor C21, the input transistor M21, the degeneration inductors L21 and L22, the capacitors C22, C23, and C24, and the transistors M22, M23, and M24 may be one circuitry for outputting the second output signals OUT2p and OUT2n.

Referring to FIG. 10A, the first amplifier stage AS1f of the LNA 261f may include m circuitries which share the input transistors M11 and M12, and the second amplifier stage AS2f may include m circuitries having the same structure. Similar to that described above with reference to FIGS. 9A and 9B, one of the m circuitries of the first amplifier stage AS1f may be enabled in a first mode in which one differential signal (i.e., OUT1p or OUT1n) is output, and at least two of the m circuitries of the second amplifier stage AS2f may be enabled in modes in which two or more differential signals are output.

Referring to FIG. 10B, the LNA 261g may include a tapped inductor TLg, and may be shared by first and second amplifier stages AS1g and AS2g as a degeneration inductor. That is, both of inductors L31 and L32 of the tapped inductor TLg may function as a degeneration inductor of the first amplifier stage AS1g in the first mode in which one differential signal (i.e., OUT1p or OUT1n) is output, and the inductor L32 of the tapped inductor TLg may function as a degeneration inductor of the second amplifier stage AS2g in the modes in which two or more differential signals are output.

Figure 11A:
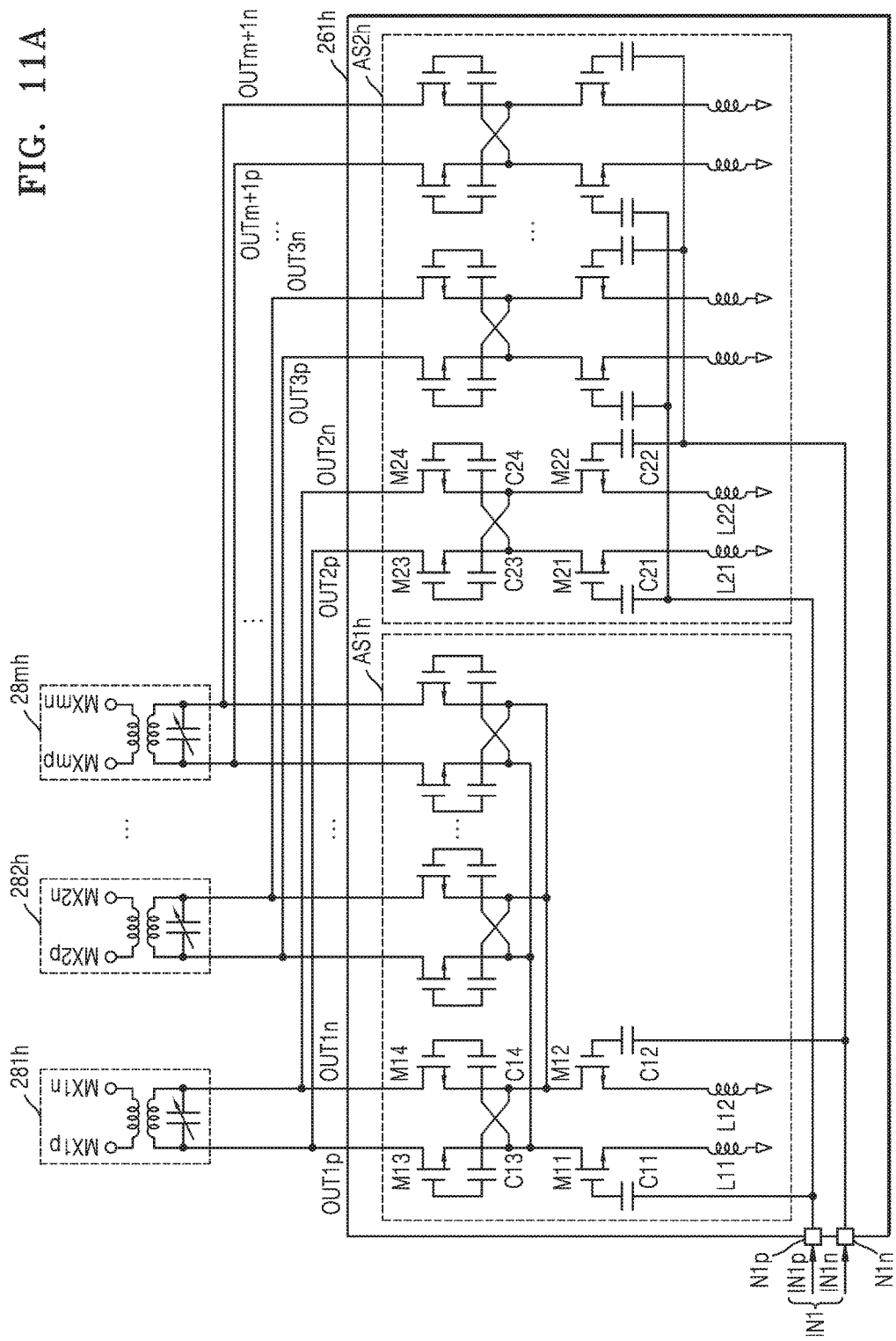
FIGS. 11A and 11B are views illustrating examples of the LNA and the load circuits of FIG. 1 according to example embodiments of the inventive concepts.
Figure 11B:
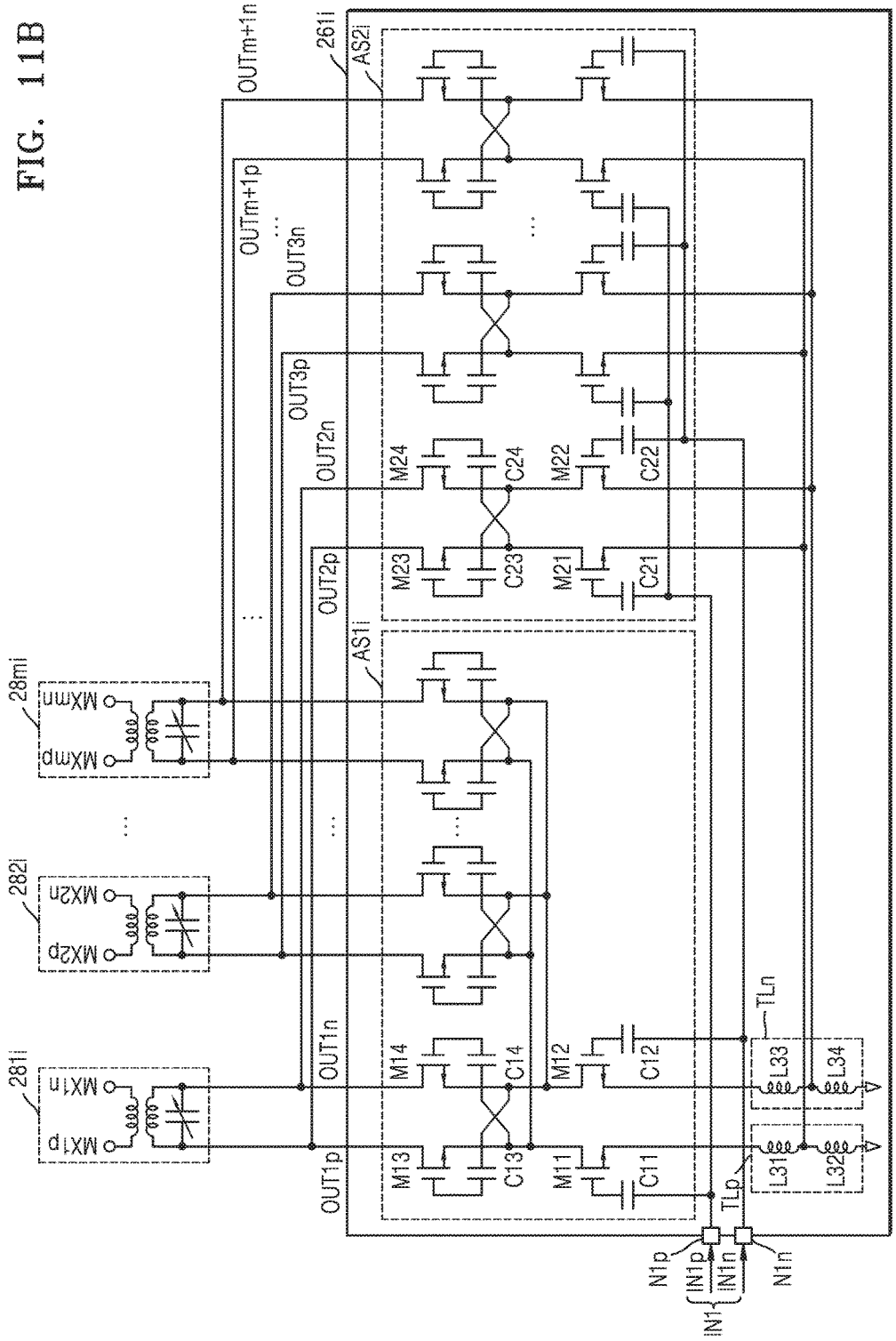

FIGS. 11A and 11B are views illustrating examples of the LNA 261 and the load circuits 280 of FIG. 1 according to example embodiments of the inventive concepts. Specifically, FIGS. 11A and 11B illustrate load circuits including LNAs 261h and 261i which output at least one of m output signals, which is a differential signal, by amplifying a first input signal IN1 which is a differential signal and a transformer. The LNAs 261h and 261i may include first amplifier stages AS1h and AS1i and second amplifier stages AS2h and AS2i, which are connected to input terminals N1p and N1n and receive the first input signal IN1 from the input terminals N1p and N1n, respectively. Hereinafter, description of FIGS. 11A and 11B, which is the same as the description of FIGS. 10A and 10B, will be omitted.

According to the example embodiment of the inventive concepts, the LNA 261 of FIG. 1 may receive the first input signal IN1 which is a differential signal, and provide an output signal as a differential signal by amplifying the first input signal IN1. For example, as illustrated in FIG. 11A, the first amplifier stage AS1h of the LNA 261h may include input capacitors C11 and C12, which receive a positive input signal IN1p and a negative input signal IN1n of the first input signal IN1, respectively, input transistors M11 and M12, and m circuitries each including a circuitry having capacitors C13 and C14 and transistors M13 and M14. Also, the second amplifier stage AS2h of the LNA 261h may provide second output signals OUT2p and OUT2n, which are differential signals, by amplifying the positive input signal IN1p and the negative input signal IN1n of the first input signal IN1 by using input capacitors C21 and C22, input transistors M21 and M22, degeneration inductors L21 and L22, capacitors C23 and C24, and transistors M23 and M24. That is, the input capacitors C21 and C22, the input transistors M21 and M22, the degeneration inductors L21 and L22, the capacitors C23 and C24, and the transistors M23 and M24 may be one circuitry for outputting the second output signals OUT2p and OUT2n.

Referring to FIG. 11A, the first amplifier stage AS1h of the LNA 261h may include m circuitries which share the input transistors M11 and M12, whereas the second amplifier stage AS2h may include m circuitries having the same structure. Similar to that described above with reference to FIGS. 10A and 10B, one of the m circuitries of the first amplifier stage AS1h may be enabled in a first mode in which one differential signal (i.e., OUT1p or OUT1n) is output, and at least two of the m circuitries of the second amplifier stage AS2h may be enabled in modes in which two or more differential signals are output.

Referring to FIG. 11B, the LNA 261i may include tapped inductors TLp and TLn, and may be shared by first and second amplifier stages AS1i and AS2i as a degeneration inductor. That is, all of inductors L31 and L32 of the tapped inductor TLp and inductors 133 and L34 of the tapped inductor TLn may function as a degeneration inductor of the first amplifier stage AS1i in a first mode in which one differential signal (i.e., OUT1p or OUT1n) is output, and the inductor L32 of the tapped inductor TLp and the inductor L34 of the tapped inductor TLn may function as a degeneration inductor of the second amplifier stage AS2i in modes in which two or more differential signals are output.

FIG. 12 is a block diagram illustrating an example of the LNAs 260 and the load circuits 280 of FIG. 1 according to an example embodiment of the inventive concepts. As described above with reference to FIG. 1, LNAs 260" of FIG. 12 may provide output signals OUTs through a plurality of lines by amplifying input signals INs through a plurality of lines, and load circuits 280" may provide a transceiver output signal TRX_OUT from the plurality of output signals OUTs.

Referring to FIG. 12, the LNAs 260" may include k LNAs LNA1 to LNAk (k is an integer greater than 1). The k LNAs LNA1 to LNAk may receive k input signals IN1 to INk, respectively. In the example of FIG. 12, each of the k LNAs LNA1 to LNAk may have a similar structure to that of the LNA 261c of FIGS. 8A to 8C, in which three output signals are provided from one input signal. As illustrated in FIG. 12, outputs of the k LNAs LNA1 to LNAk may be connected to each other.

The load circuits 280" may include baluns 282, mixers 284, filters 286, and buffers 288 as illustrated in FIG. 12. The baluns 282 may convert one phase output signal provided from the LNAs 260" into a differential phase signal, and provide the differential signal to the mixers 284. For example, as illustrated in FIG. 12, the baluns 282 may include transformers, and each of the transformers may include a primary coil to which one phase signal is applied and a secondary coil which outputs a differential phase signal.

The mixers 284 may down-convert differential signals provided from the baluns 282. For example, the mixers 284 may receive vibration signals LO1 to LO3 corresponding to frequencies of carrier signals, and may move the differential signals provided from the baluns 282 to a baseband based on the vibration signals LO1 to LO3. The filters 286 may remove unnecessary frequency components by filtering the signals moved to the baseband.

The buffers 288 may provide the transceiver output signal TRX_OUT by amplifying the filtered signals to a predetermined gain. As described above, each of the k LNAs may operate differently according to an operation mode, and may be designed to reduce variations of an input impedance according to the operation mode. A ratio of the input signals INs to the transceiver output signal TRX_OUT, that is, an overall gain, may be changed in each of operation modes, and the buffers 288 may compensate for variations of overall gain per such an operation mode. That is, a gain of the buffer included in the buffers 288 may be varied based on the mode signal MD provided from the controller 300 of FIG. 1. For example, each of the buffers included in the buffers 288 may include a variable resistor, and the gain of the buffer may be changed by changing a resistance of the variable resistor based on the mode signal MD. Accordingly, even though the operation mode of the LNA, that is, the setting of the carriers is changed, the transceiver output signal TRX_OUT may have a constant magnitude.

Figure 13:
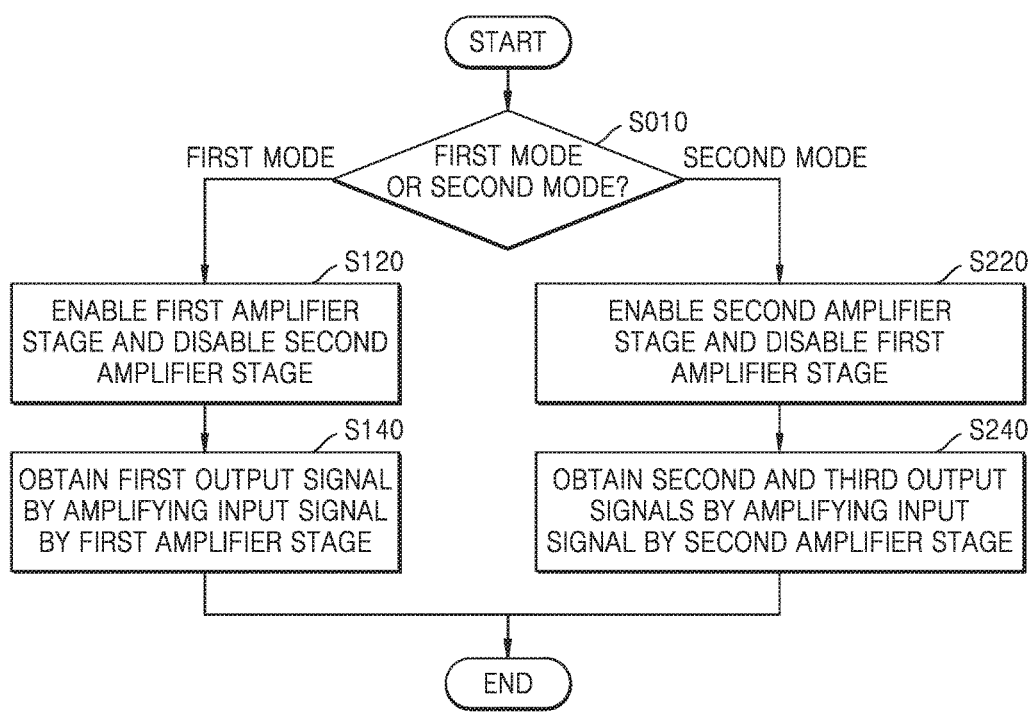
FIG. 13 is a flowchart illustrating a method of amplifying an input signal including at least one carrier according to an example embodiment of the inventive concepts.

FIG. 13 is a flowchart illustrating a method of amplifying an input signal including at least one carrier according to an example embodiment of the inventive concepts. For example, the method of FIG. 13 may be performed by the LNAs 261 of FIG. 1. Hereinafter, the method of FIG. 13 will be described with reference to FIG. 1.

In operation S010, an operation of determining whether an operation mode of the LNA 261 is a first mode or a second mode may be performed. For example, the controller 300 may provide a mode signal MD based on the setting of the carriers, and the LNA 261 may determine whether an operation mode is a first mode or a second mode based on the mode signal MD received from the controller 300. The first mode may refer to an operation mode for providing one output signal, that is, a first output signal OUT1, by amplifying a first input signal IN1, and the second mode may refer to an operation mode for providing two output signals, that is, second and third output signals OUT2 and OUT3, by amplifying the first input signal IN1. When it is determined that the operation mode of the LNA 260 is the first mode, operations S120 and S140 may be performed subsequently, and when it is determined that the operation mode of the LNA 260 is the second mode, operations S220 and S240 may be performed subsequently.

In operation S120, an operation of enabling a first amplifier stage and disabling a second amplifier stage may be performed. For example, the first amplifier stage AS1 included in the LNA 261 may provide the first output signal OUT1 by amplifying the first input signal IN1, and the second amplifier stage AS2 included in the LNA 261 may provide the second and third output signals OUT2 and OUT3 by amplifying the first input signal IN1. Accordingly, in the first mode, the first amplifier stage AS1 may be enabled and the second amplifier stage AS2 may be disabled. Details of operation S120 will be described with reference to FIG. 14.

In operation S140, an operation of amplifying an input signal by a first amplifier stage and obtaining a first output signal may be performed. For example, the enabled first amplifier stage AS1 may provide the first output signal OUT1 by amplifying the first input signal IN1. In this case, an input impedance of the LNA 261 may be an impedance in which an input impedance of the enabled first amplifier stage AS1 and an input impedance of the disabled second amplifier stage AS2 are connected in parallel.

In operation S220, an operation of enabling a second amplifier stage and disabling a first amplifier stage may be performed. For example, in the second mode, the first amplifier stage AS1 may be disabled and the second amplifier stage AS2 may be enabled. Details of operation S220 will be described with reference to FIG. 15.

In operation S240, an operation of amplifying an input signal by a second amplifier stage and obtaining second and third output signals may be performed. For example, the enabled second amplifier stage AS2 may provide the second and third output signals OUT2 and OUT3 by amplifying the first input signal IN1. In this case, the input impedance of the LNA 261 may be an impedance in which an input impedance of the disabled first amplifier stage AS1 and an input impedance of the enabled second amplifier stage AS2 are connected in parallel. As described above with reference to FIGS. 5A and 5B, the first and second amplifier stages AS1 and AS2 may be designed so that a difference between the input impedances of the LNA 261 in the first and second modes is reduced, and thus the LNA 261 may have substantially the same attenuation ratio of the input signal in the first and second modes.

Figure 14:
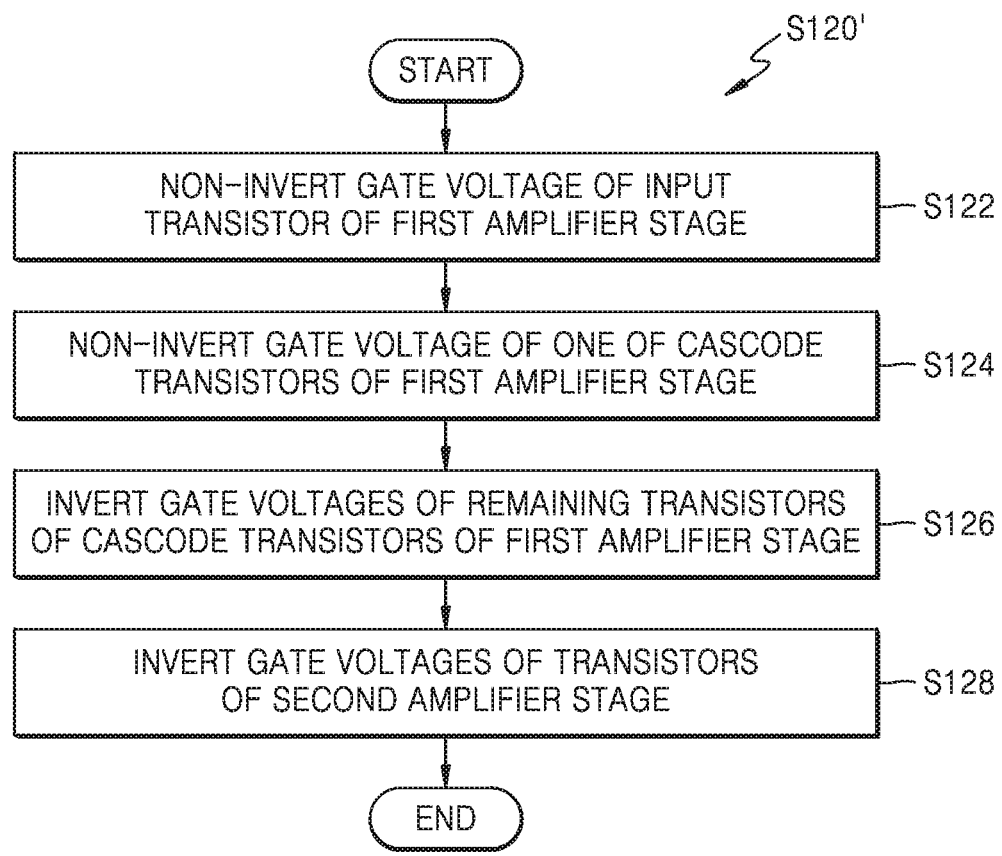
FIG. 14 is a flowchart illustrating an example of operation S120 of FIG. 13 according to an example embodiment of the inventive concepts.

FIG. 14 is a flowchart illustrating an example of operation S120 of FIG. 13 according to an example embodiment of the inventive concepts. As described above with reference to FIG. 13, in operation S120' of FIG. 14, an operation of enabling a first amplifier stage and disabling a second amplifier stage may be performed. For example, operation S120' may be performed by the LNA 261a of FIGS. 6A and 6B, which operates in the first mode. Hereinafter, the operation of FIG. 14 will be described with reference to FIGS. 6A and 6B.

In operation S122, an operation of non-inverting a gate voltage of an input transistor of the first amplifier stage may be performed. For example, as illustrated in FIG. 6A, when the input transistor M11 of the first amplifier stage AS1a is an NMOS transistor, a gate voltage of the input transistor M11 may be a high voltage (e.g., a turn-on voltage).

In operation S124, an operation of non-inverting a gate voltage of one of cascode transistors of the first amplifier stage may be performed. For example, as illustrated in FIGS. 6A and 6B, a gate voltage of one of the cascode transistors M12 and M13 of the first amplifier stage AS1a may be non-inverted. As illustrated in FIG. 6A, when the cascode transistor M12 is enabled, that is, has a high gate voltage, the first output signal OUT1 may be provided to the first load circuit 281a through the cascode transistor M12. On the other hand, as illustrated in FIG. 6B, when the cascode transistor M13 is enabled, that is, has a high gate voltage, the first output signal OUT1 may be provided to the second load circuit 282a through the cascode transistor M13.

In operation S126, an operation of inverting gate voltages of the remaining transistors of the cascode transistors of the first amplifier stage may be performed. For example, as illustrated in FIG. 6A, a gate voltage of the cascode transistor M13 may become a low voltage (e.g., a ground voltage or a turn-off voltage), and as illustrated in FIG. 6B, a gate voltage of the cascode transistor M12 may become a low voltage (e.g., a ground voltage or a turn-off voltage).

In operation S128, an operation of inverting gate voltages of transistors of the second amplifier stage may be performed. For example, as illustrated in FIGS. 6A and 6B, in order to disable the second amplifier stage AS2a, gate voltages of the transistors M21 to M24 included in the second amplifier stage AS2a may become a low voltage (e.g., a ground voltage or a turn-off voltage).

Figure 15:
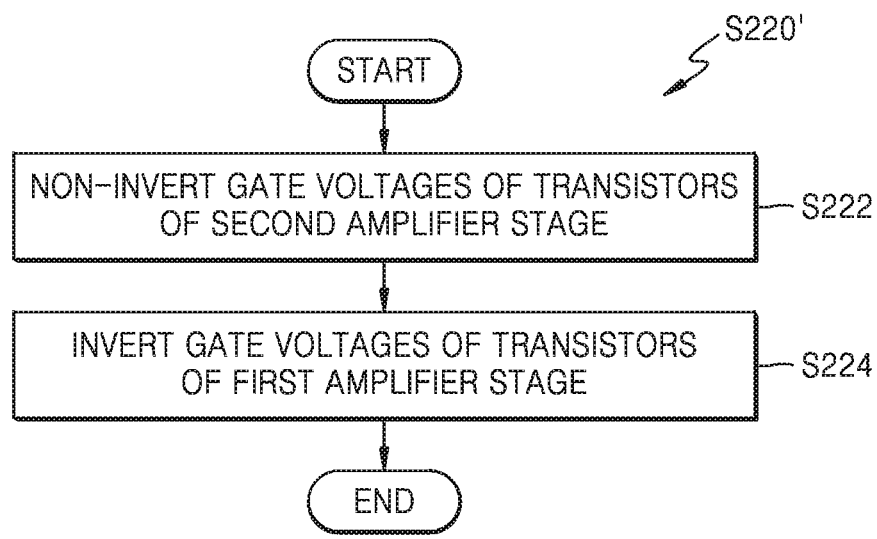
FIG. 15 is a flowchart illustrating an example of operation S220 of FIG. 13 according to an example embodiment of the inventive concepts.

FIG. 15 is a flowchart illustrating an example of operation S220 of FIG. 13 according to an example embodiment of the inventive concepts. As described above with reference to FIG. 13, in operation S220' of FIG. 15, an operation of enabling a second amplifier stage and disabling a first amplifier stage may be performed. For example, the operation may be performed by the LNA 261a, which operates in the second mode. Hereinafter, the operation of FIG. 15 will be described with reference to FIG. 6C.

In operation S222, an operation of non-inverting gate voltages of transistors of the second amplifier stage may be performed. For example, in order to enable the second amplifier stage AS2a, gate voltages of the transistors M21 to M24 included in the second amplifier stage AS2a may become a high voltage (e.g., a turn-on voltage).

In operation S224, an operation of inverting gate voltages of transistors of the first amplifier stage may be performed. For example, in order to disable the first amplifier stage AS1a, gate voltages of the transistors M11 to M13 included in the first amplifier stage AS1a may become a low voltage (e.g., a ground voltage or a turn-off voltage).

Figure 16:
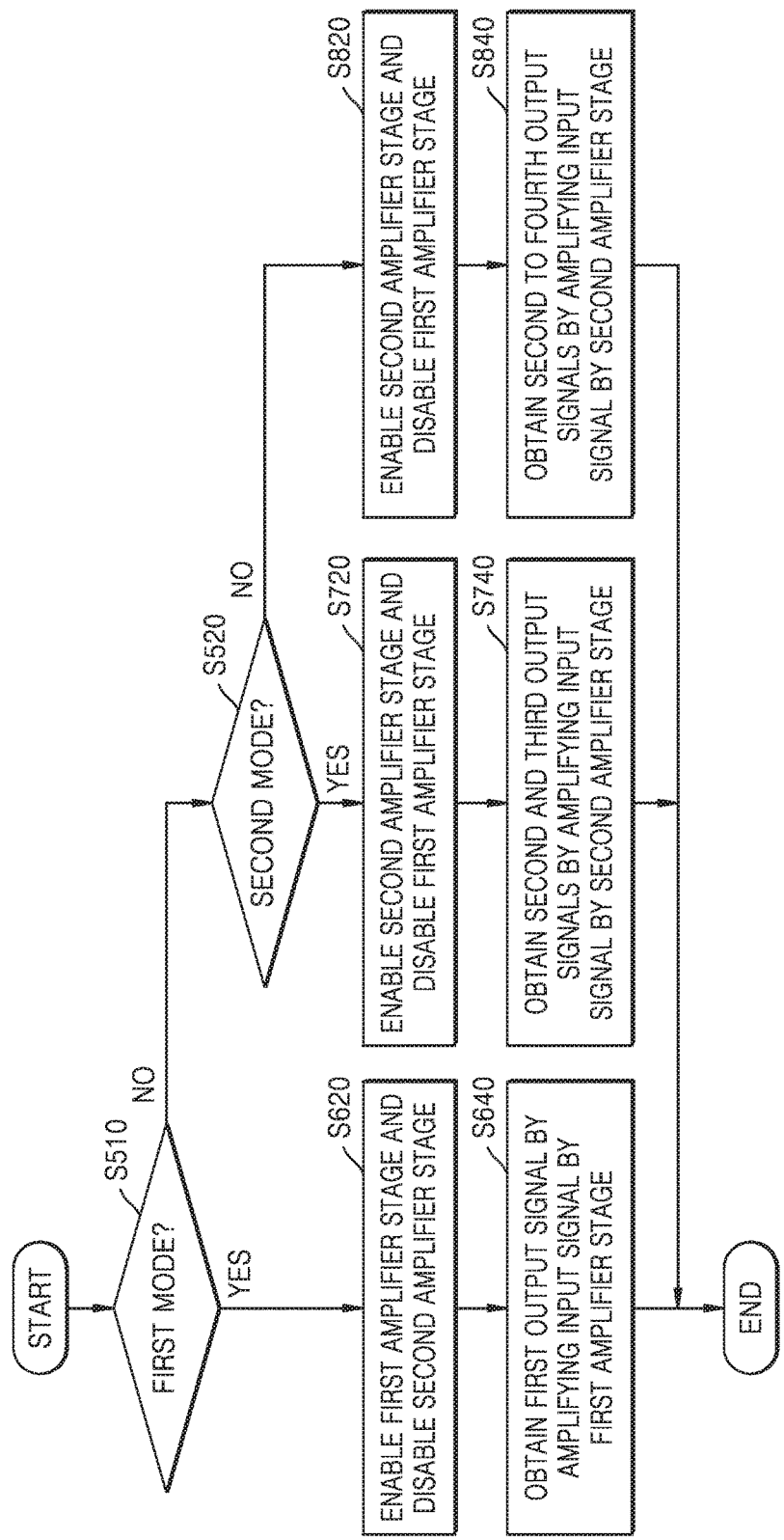
FIG. 16 is a flowchart illustrating a method of amplifying an input signal including at least one carrier according to an example embodiment of the inventive concepts.

FIG. 16 is a flowchart illustrating a method of amplifying an input signal including at least one carrier according to an example embodiment of the inventive concepts. As illustrated in FIG. 16, the method of FIG. 16 may include a plurality of operations S510, S520, S620, S640, S720, S740, S820, and S840, and may be performed by, for example, the LNA 261c of FIGS. 8A to 8C. Hereinafter, the method of FIG. 16 will be described with reference to FIGS. 8A to 8C.

In operation S510, an operation of determining whether the LNA 261c is in a first mode may be performed. For example, the LNA 261c may be determined whether an operation mode is a first mode based on a mode signal MD provided from the controller 300 of FIG. 1. The first mode may refer to an operation mode for providing one output signal, that is, a first output signal OUT1, by amplifying a first input signal IN1. When it is determined that the operation mode of the LNA 261c is the first mode, operations S620 and S640 may be performed subsequently, and when it is determined that the operation mode of the LNA 261c is not the first mode, operation S520 may be performed subsequently.

In operation S620, an operation of enabling a first amplifier stage and disabling a second amplifier stage may be performed. For example, the first amplifier stage AS1c may include the input transistor M11 and the three cascode transistors M12 to M14. The first amplifier stage AS1c may enable the input transistor M11, enable one of the three cascode transistors M12 to M14, and disable the remaining two transistors as described above with reference to FIG. 14. Also, the second amplifier stage AS2c may disable the transistors M21 to M26 included in the second amplifier stage AS2c.

In operation S640, an operation of amplifying an input signal by a first amplifier stage and obtaining a first output signal may be performed. For example, the first output signal OUT1 generated by amplifying the first input signal IN1 in the first amplifier stage AS1c may be provided through the enabled cascode transistors among the three cascode transistors M12 to M14.

In operation S520, an operation of determining whether the LNA 261c is in a second mode may be performed. For example, the LNA 261c may determine whether the operation mode is a second mode based on the mode signal MD. When it is determined that the operation mode is not the second mode, it may be determined that the operation mode is a third mode. The second mode may refer to an operation mode for providing two output signals, that is, two of second to fourth output signals OUT2 to OUT4, by amplifying the first input signal IN1, and the third mode may refer to an operation mode for providing three output signals, that is, the second to fourth output signals OUT2 to OUT4, by amplifying the first input signal IN1. When it is determined that the operation mode of the LNA 261c is the second mode, operations S720 and S740 may be performed subsequently, and when it is determined that the operation mode of the LNA 261c is the third mode, operations S820 and S840 may be performed subsequently.

In operation S720, an operation of enabling a second amplifier stage and disabling a first amplifier stage may be performed. For example, only transistors for providing two output signals among transistors included in the second amplifier stage AS2c may be enabled. For example, as illustrated in FIG. 8B, the transistors M21 to M24 related to the second and third output signals OUT2 and OUT3 may be enabled, and the other transistors M25 and M26 may be disabled. Also, the transistors included in the first amplifier stage AS1c may be disabled.

In operation S740, an operation of amplifying an input signal by a second amplifier stage and obtaining second and third output signals may be performed. Although the provided output signals in the second mode are illustrated as being the second and third output signals OUT2 and OUT3 in FIG. 16, it will be appreciated that any two of the second to fourth output signals OUT2 to OUT4 may be provided.

In operation S820, an operation of enabling a second amplifier stage and disabling a first amplifier stage may be performed. For example, similar to that illustrated in FIG. 15, in the third mode, the transistors M21 to M26 included in the second amplifier stage AS2c may be enabled and the transistors M11 to M14 included in the first amplifier stage AS1c may be disabled.

In operation S840, an operation of amplifying an input signal by a second amplifier stage and obtaining second to fourth output signals may be performed. For example, the enabled second amplifier stage AS2c may provide the second to fourth output signals OUT2 to OUT4 by amplifying the first input signal IN1.

While the inventive concepts have been particularly shown and described with reference to example embodiments thereof, it will be understood that various changes in form and details may be made therein without departing from the spirit and scope of the following claims.

What is claimed is:

1. An apparatus comprising:
   an input terminal configured to receive an input signal including at least one carrier;
   a first amplifier electrically connected to the input terminal, enabled in a first mode to output a first output signal by amplifying the input signal, and disabled in a second mode, the first output signal being one of amplified output signals, the first amplifier being configured to output a first number of the amplified output signals in the first mode; and
   a second amplifier electrically connected to the input terminal, enabled in the second mode to output second and third output signals by amplifying the input signal, and disabled in the first mode, the second output signal and third output signal each being one of the amplified output signals, the second amplifier being configured to output a second number of the amplified output signals in the second mode, the first number being different from the second number.

2. The apparatus of claim 1, wherein
   the first amplifier has an input impedance in the first mode, and an input impedance in the second mode, the input impedance of the first amplifier in the first mode is different from the input impedance in the second mode, and
   the second amplifier has an input impedance in the first mode, and an input impedance in the second mode, the input impedance of the second amplifier in the first mode is different from the input impedance in the second mode.

3. The apparatus of claim 2, wherein the input impedance in the first mode of the first amplifier, the input impedance in the first mode of the second amplifier, the input impedance in the second mode of the first amplifier, and the input impedance in the second mode of the second amplifier have impedance values such that the input signal has an attenuation ratio in the first mode that is substantially the same as an attenuation ratio in the second mode.

4. The apparatus of claim 1, wherein the first and second amplifiers are enabled or disabled by controlling gate voltages of transistors included in each of the first and second amplifier.

5. The apparatus of claim 1, wherein
   the first amplifier includes
      a first input transistor configured to receive the input signal, and
      a first cascode transistor connected to the first input transistor, the first cascode transistor configured to provide the first output signal, and the second amplifier includes
   second and third input transistors configured to receive the input signal,
   and second and third cascode transistors connected to the second and third input transistors, respectively, the second and third transistors configured to provide the second and third output signals, respectively.

6. The apparatus of claim 5, wherein
   the first amplifier further includes a fourth cascode transistor connected to the first input transistor and configured to provide the first output signal, and
   one of the first and fourth cascode transistors is disabled in the first mode.

7. The apparatus of claim 6, further comprising:
   a first load circuit configured to receive the first output signal from the first cascode transistor or receive the second output signal from the second cascode transistor; and a second load circuit configured to receive the first output signal from the fourth cascode transistor or receive the third output signal from the third cascode transistor.

8. The apparatus of claim 7 further comprising:
a third load circuit,
wherein
the first amplifier further includes a fifth cascode transistor connected to the first input transistor, configured to provide the first output signal, and enabled when the first and fourth cascode transistors are disabled in the first mode, and
the second amplifier further includes a fourth input transistor configured to receive the input signal and a sixth cascode transistor connected to the fourth input transistor and configured to provide a fourth output signal, and
the third load circuit is configured to receive the first output signal from the fifth cascode transistor or receive the fourth output signal from the sixth cascode transistor.

9. The apparatus of claim 7, wherein
the first load circuit includes a transformer including a primary coil connected to the first and second cascode transistors and a secondary coil configured to provide a first differential output signal derived from the first or second output signal, and
the second load circuit includes a transformer including a primary coil connected to the third and fourth cascode transistors and a secondary coil configured to provide a second differential output signal derived from the first or third output signal.

10. The apparatus of claim 7, wherein
the first load circuit includes a first variable gain amplifier configured to amplify a signal down-converted from the first or second output signal in the first and second modes as different gains, and
the second load circuit includes a second variable gain amplifier configured to amplify a signal down-converted from the first or third output signal in the first and second modes as different gains.

11. The apparatus of claim 5, wherein
the first amplifier further includes a first degeneration inductor having a first end and a second end connected to a source of the first input transistor and a ground, respectively, and
the second amplifier further includes a second degeneration inductor having a first end and a second end connected to a source of the second input transistor and the ground, and a third degeneration inductor having two ends connected to a source of the third input transistor and the ground, respectively.

12. The apparatus of claim 5, further comprising:
a tapped inductor having a first end and a second end connected to a source of the first input transistor and a ground, respectively, the tapped inductor also having a tap connected to sources of the second and third input transistors.

13. The apparatus of claim 1, wherein the second and third output signals include component carriers according to non-contiguous intra-band carrier aggregation.

14. The apparatus of claim 1, wherein
the first amplifier includes a first input transistor and first and second active balanced-to-unbalanced (balun) circuits, the first input transistor is configured to receive the input signal and the first and second active balanced-to-unbalanced (balun) circuits are configured to output the first output signal, which is a differential signal, from an output signal of the first input transistor, the first and second balun circuits are alternatively enabled, and
the second amplifier includes second and third input transistors and third and fourth active balun circuits, the second and third input transistors are configured to receive the input signal and the third and fourth active balun circuits are configured to output the second and third output signals, respectively, the second and third output signals are differential signals from output signals of the second and third input transistors, respectively.

15. The apparatus of claim 1, wherein
the first amplifier includes
a first input capacitor connected to the input terminal, and
a first input transistor configured to receive the input signal through the first input capacitor; and
the second amplifier includes,
second and third input capacitors connected to the input terminal, and
second and third transistors configured to receive the input signal through the second and third input capacitors, respectively.

16. An apparatus comprising:
an input terminal configured to receive an input signal including at least one carrier;
a first amplifier electrically connected to the input terminal, the first amplifier configured to amplify the input signal and to output a first output signal if the first amplifier receives a first enable signal, the first output signal including the amplified input signal, the first output signal being one of amplified output signals, the first output signal being configured to output a first number of the amplified output signals if the first amplifier receives the first enable signal; and
a second amplifier electrically connected to the input terminal, the second amplifier configured to amplify the input signal and output a second output signal and a third output signal if the second amplifier receives a second enable signal, the second output signal including the amplified input signal and the third output signal including the amplified input signal, the second output signal and the third output signals each being one of the amplified output signals, the second output signal being configured to output a second number of the amplified output signals if the second amplifier receives the second enable signal, the first number and the second number being different.

17. A transceiver comprising:
the apparatus of claim 16;
duplexers configured to receive a transceiver input signal and route the transceiver input signal;
input circuits electrically connected to the duplexers, the input circuits including matching circuits which perform power or impedance matching, the input circuits electrically connected to the input terminal, the input circuits configured to receive the transceiver input signal and output the input signal; and
load circuits configured electrically connected to the apparatus, the load circuits configured to receive the first output, second output and third output, to extract a signal transmitted by a carrier, and to output transceiver output signals.

18. A device comprising:
the transceiver of claim 17;
an antenna electrically connected to the duplexers, the antenna configured to receive input signals and output the transceiver input, the transceiver input includes the input signals; and
a controller configured to receive the transceiver output to, and to generate the first enable signal and the second enable signal based on an operation mode.

19. The apparatus of claim 16 wherein
the input terminal has a first input impedance when the first enable signal is received by the first amplifier and the second enable signal is not received by the second amplifier, and the input terminal has a second input impedance when the second enable signal is received by the second amplifier and the first enable signal is not received by the first amplifier, the first input impedance and the second input impedance are similar such that the input signal has an attenuation ratio that is substantially the same if the first enable signal is received by the first amplifier and the second enable signal is not received by the second amplifier, or if the second enable signal is received by the second amplifier and the first enable signal is not received by the first amplifier.

20. The apparatus of claim 16 wherein the second amplifier is configured to amplify the input signal and to output a second output signal, a third output signal, and a fourth output signal if the second amplifier receives a second enable signal, the second output signal including the amplified input signal, the third output signal including the amplified input signal, and the fourth output signal including the amplified signal.

\* \* \* \* \*